(12) United States Patent
Takeda et al.

(10) Patent No.: US 9,123,689 B2
(45) Date of Patent: Sep. 1, 2015

(54) EPOXY RESIN COMPOSITION, METHOD FOR PRODUCING SAME, AND SEMICONDUCTOR DEVICE USING SAME

(75) Inventors: Sayaka Takeda, Otsu (JP); Masao Tomikawa, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 104 days.

(21) Appl. No.: 14/004,841

(22) PCT Filed: Mar. 15, 2012

(86) PCT No.: PCT/JP2012/056762
§ 371 (c)(1),
(2), (4) Date: Sep. 12, 2013

(87) PCT Pub. No.: WO2012/124780
PCT Pub. Date: Sep. 20, 2012

(65) Prior Publication Data
US 2014/0005318 A1    Jan. 2, 2014

(30) Foreign Application Priority Data
Mar. 16, 2011 (JP) .................................. 2011-057711

(51) Int. Cl.
| | | |
|---|---|---|
| *C08K 5/07* | (2006.01) | |
| *C08L 63/00* | (2006.01) | |
| *C08L 79/08* | (2006.01) | |
| *H01L 23/29* | (2006.01) | |
| *H01L 23/373* | (2006.01) | |
| *C08G 73/10* | (2006.01) | |

(52) U.S. Cl.
CPC ........ *H01L 23/3737* (2013.01); *C08G 73/1039* (2013.01); *C08K 5/07* (2013.01); *C08L 63/00* (2013.01); *C08L 79/08* (2013.01); *H01L 23/293* (2013.01); *H01L 2924/0002* (2013.01)

(58) Field of Classification Search
None
See application file for complete search history.

(56) References Cited

U.S. PATENT DOCUMENTS

| 7,691,475 B2 * | 4/2010 | Larson et al. .......... 428/355 BL |
| 2002/0022310 A1 * | 2/2002 | Han et al. .................... 438/200 |

FOREIGN PATENT DOCUMENTS

| JP | 7-268077 A | * | 10/1995 |
|---|---|---|---|
| JP | 2001-72833 A | * | 3/2001 |
| JP | 2003-221443 A | * | 8/2003 |
| JP | 2004-35650 A | * | 2/2004 |
| JP | 2006-28294 A | * | 2/2006 |
| JP | 2007-169454 A | * | 7/2007 |
| JP | 2008-81686 A | * | 4/2008 |
| JP | 2008-274300 A | * | 11/2008 |
| JP | 2009-149742 A | * | 7/2009 |
| JP | 2009-155354 A | * | 7/2009 |
| JP | 2009-161605 A | * | 7/2009 |
| JP | 2009-203252 A | | 9/2009 |
| JP | 2010-90237 A | * | 4/2010 |
| JP | 2010-95645 A | * | 4/2010 |
| JP | 2010-95646 A | * | 4/2010 |
| JP | 2010-132793 A | | 6/2010 |
| JP | 2011-46928 A | | 3/2011 |

OTHER PUBLICATIONS

International Search Report issued in PCT/JP2012/056762 mailed Apr. 17, 2012.

* cited by examiner

*Primary Examiner* — Robert Sellers
(74) *Attorney, Agent, or Firm* — Birch, Stewart, Kolasch & Birch, LLP

(57) ABSTRACT

Disclosed is an epoxy resin composition which has excellent workability and excellent thermal resistance after curing. The epoxy resin composition contains a compound which has a specific imide structure obtained by reacting a diamine having a phenolic hydroxyl group, such as 2,2-bis(3-amino-4-hydroxyphenyl)hexafluoropropane (6FAP), with a tetracarboxylic dianhydride, and which has a number average molecular weight of 1,000 to 5,000; and a compound having at least two epoxy groups, such as a bisphenol A type epoxy resin.

9 Claims, No Drawings

EPOXY RESIN COMPOSITION, METHOD FOR PRODUCING SAME, AND SEMICONDUCTOR DEVICE USING SAME

TECHNICAL FIELD

The present invention relates to an epoxy resin composition which has excellent thermal resistance and low coefficient of thermal expansion, and which is soluble in a ketone solvent to have excellent workability; and to a semiconductor device using the same.

BACKGROUND ART

In recent years, the size of semiconductor elements has been enlarged rapidly, and large thermal stress is formed between the semiconductor element and substrate. This is caused by the difference between the coefficient of thermal expansion of the semiconductor element composed of silicon and the coefficient of thermal expansion of the substrate based on an epoxy resin. The thermal stress is formed mainly at solder bump which connects the semiconductor element and the substrate, and underfill agents and the like are filled to relieve the stress. Although such a stress relaxation has an effect to some extent, it is necessary that the coefficient of thermal expansion of the substrate is substantially reduced to as low as that of the semiconductor element.

Aiming at decreasing the influence on environment, the solders have been changed from conventional lead-containing ones to lead-free type ones composed of tin, silver and the like. Since the lead-free solders need solder connection at higher temperature than the lead-containing solders, the substrate materials are required to have higher glass transition temperature than before.

To lower the coefficient of thermal expansion of an epoxy resin, a method of adding an inorganic filler is usually employed (see, for example, Patent Literature 1).

To raise the glass transition temperature of an epoxy resin, a method in which phloroglucinol is added to the epoxy resin (see, for example, Patent Literature 2); a method in which a curing agent having three or more phenolic hydroxyl groups is added to the epoxy resin (see, for example, Patent Literature 3); a method in which a cyanate ester resin is added to the epoxy resin (see, for example, Patent Literature 4); and a method in which a resin composition containing an epoxy resin, polyhydric phenol epoxy resin curing agent and polyethersulfone is added (see, for example, Patent Literature 5) and the like are provided.

Further, a method in which the adhesive property to a semiconductor element is enhanced by employing a thermosetting resin composition containing a bismaleimide compound and an epoxy resin (see, for example, Patent Literature 6); and a method in which high thermal resistance is attained by employing a liquid epoxy resin composition containing a liquid epoxy resin, curing agent and polyether compound, or by employing a composition containing an epoxy resin and a polyimide having a specific structure (see, for example, Patent Literature 7) are disclosed. However, the resin compositions disclosed in those literatures have problems in that the workability is poor due to insolubility in a solvent having low boiling point, and the thermal resistance is insufficient.

Aiming at improving the workability and thermal resistance, many heat-resistant resin compositions are provided, such as a thermosetting resin composition composed of a polyimide obtained by reacting a substituted guanamine compound and at least two unsaturated N-substituted maleimide groups (see Patent Literature 8); a cure type composition in which a polymer having an epoxy equivalent of 200 to 1,000 and an epoxy compound are dissolved mutually (see Patent Literature 9); an adhesive for electronic materials composed of a polyimide having a hydroxyl group and an epoxy resin (see Patent Literature 10); a heat-resistant resin composition composed of a compound having an amino group and phenol group, bismaleimide compound and epoxy resin (see Patent Literature 11); a resin composition composed of a polymer obtained from a bismaleimide compound and diamine, polyethersulfone resin and epoxy resin (see Patent Literature 12); a heat-resistant composition composed of a maleimide compound having a hydroxyl group with a specific structure and epoxy compound having two or more glycidyl groups (see Patent Literature 13); and a heat-resistant composition composed of an epoxy compound, bismaleimide compound and hydroxymaleimide compound (see Patent Literature 14). However, the resin compositions disclosed in those literatures have problems in that the molecular weight of polyimides to be blended is large, and the viscosity when mixed with an epoxy resin composition is too high.

PRIOR ART REFERENCES

Patent Literatures

Patent Literature 1: JP 2006-28294 A (Caims)
Patent Literature 2: JP 2010-95646 A (Claims)
Patent Literature 3: JP 2010-95645 A (Claims)
Patent Literature 4: JP 2010-90237 A (Claims)
Patent Literature 5: JP 2001-72833 A (Claims)
Patent Literature 6: JP 2003-221443 A (Claims)
Patent Literature 7: JP 2008-81686 A (Claims)
Patent Literature 8: JP 2009-149742 A (Claims)
Patent Literature 9: JP 2008-274300 A (Claims)
Patent Literature 10: JP 2004-35650 A (Claims)
Patent Literature 11: JP 2007-169454 A (Claims)
Patent Literature 12: JP 2009-155354 A (Claims)
Patent Literature 13: JP 2009-161605 A (Claims)
Patent Literature 14: JP 7-268077 A (Claims)

SUMMARY OF THE INVENTION

Problems to be Solved by the Invention

In view of the above-described problems, an object of the present invention is to provide an epoxy resin composition which satisfies all of storage stability, thermal resistance after curing and low thermal expansibility, and which is soluble in a solvent such as cyclohexanone to have low viscosity and excellent workability.

Means for Solving the Problems

To solve the above-described problems, a resin composition of the present invention has the following constitutions: that is, the present invention provides an epoxy resin composition comprising a compound (a) having an imide structure represented by the Formula (1), and a compound (b) having at least two epoxy groups, wherein the compound (a) having an imide structure represented by the Formula (1) has a number average molecular weight of 1,000 to 5,000:

(1)

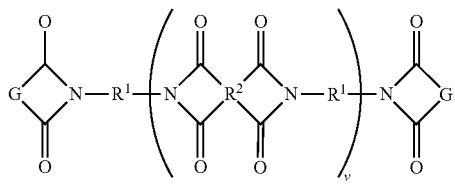

(wherein R¹ has a structure represented by the Formula (2) in an amount of not less than 50%; R² is selected from the Formulae (4) below wherein different R²s are optionally employed in combination; the benzene ring in any structures selected from the Formulae (4) below is optionally substituted by one or more groups selected from the group consisting of hydroxyl group, $C_1$-$C_4$ alkyl groups, $C_1$-$C_4$ fluoroalkyl groups, $C_1$-$C_4$ alkoxyl groups, $C_1$-$C_4$ fluoroalkoxyl groups, $C_2$-$C_5$ ester groups, carboxyl group, cyano group and nitro group; v is an integer of 1 to 8; and G is selected from the Formulae (5) below wherein different Gs are optionally employed in combination);

(2)

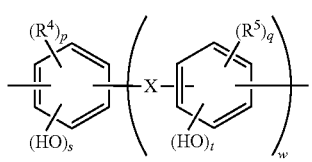

(wherein R⁴ and R⁵ are each independently selected from the group consisting of $C_1$-$C_4$ alkyl groups, $C_1$-$C_4$ fluoroalkyl groups, $C_1$-$C_4$ alkoxyl groups, $C_1$-$C_4$ fluoroalkoxyl groups, $C_2$-$C_5$ ester groups, carboxyl group, cyano group and nitro group wherein these groups are optionally employed individually or different groups are optionally employed in combination as each of R⁴ and R⁵; X is selected from the group consisting of direct bond, —$CH_2$—, —$C(CH_3)_2$—, —$C(CF_3)_2$—, —$C(C_2F_5)_2$—, —O—, —$SO_2$—, fluorene, —CO—, —COO—, —CONH—, —$CF_2$— and the Formulae (3) below wherein different Xs are optionally employed in combination; p and q are integers of 0 to 3, s and t are integers of 0 to 4, and s+t>0; and w is an integer of 0 to 8);

(3)

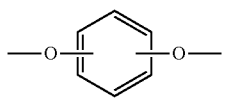

(4)

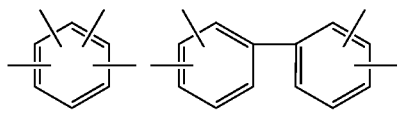

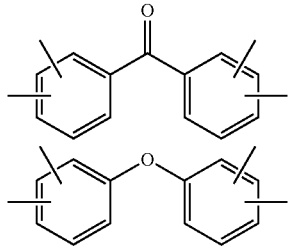

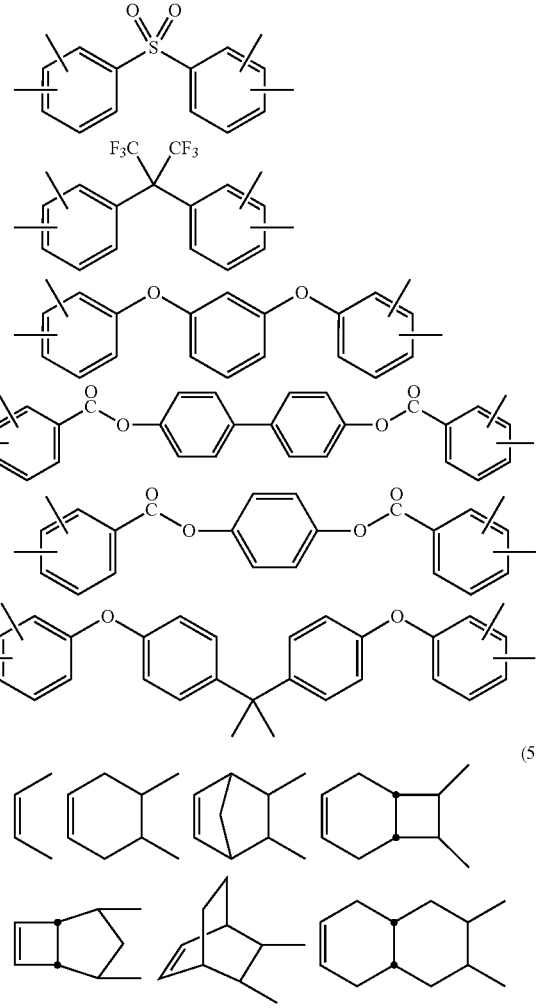

(5)

Effect of the Invention

According to the present invention, the epoxy resin composition can be provided, which composition has an extremely high glass transition temperature for the epoxy resin composition and low coefficient of thermal expansion, and which is soluble in a ketone solvent such as methyl ethyl ketone, cyclohexanone or the like to have excellent processibility.

MODE FOR CARRYING OUT THE INVENTION

The epoxy resin composition of the present invention contains a compound (a) having an imide structure represented by the above Formula (1), and a compound (b) having at least two epoxy groups, and the compound (a) having an imide structure represented by the above Formula (1) has a number average molecular weight of 1,000 to 5,000.

In the Formula (1), R¹ has a structure represented by the Formula (2) in an amount of not less than 50%. The R² is selected from the above Formulae (4) wherein different R²s are optionally employed in combination. The benzene ring in any structures selected from the above Formulae (4) is optionally substituted by one or more groups selected from the group consisting of hydroxyl group, $C_1$-$C_4$ alkyl groups, $C_1$-$C_4$ fluoroalkyl groups, $C_1$-$C_4$ alkoxyl groups, $C_1$-$C_4$ fluoroalkoxyl groups, $C_2$-$C_5$ ester groups (wherein R in an ester group represented by —COOR has 1 to 4 carbons), carboxyl group, cyano group and nitro group. The v is an integer of 1 to 8; and G is selected from the above Formulae (5) wherein different Gs are optionally employed in combination. The phrase "different groups are optionally employed in combination" in the specification and claims means that in cases where there is only one group which is represented by the symbol in one molecular, different groups are optionally employed between different molecules as the group represented by the symbol. In case where there may be two or more groups represented by the symbol in one molecular, the phrase means, in addition to the above case, that different groups are optionally employed as the group represented by the symbol also in the molecular.

In the above Formula (2), $R^4$ and $R^5$ are each independently selected from the group consisting of $C_1$-$C_4$ alkyl groups, $C_1$-$C_4$ fluoroalkyl groups, $C_1$-$C_4$ alkoxyl groups, $C_1$-$C_4$ fluoroalkoxyl groups, $C_2$-$C_5$ ester groups, carboxyl group, cyano group and nitro group wherein these groups are optionally employed individually or different groups are optionally employed in combination as each of $R^4$ and $R^5$. Among these, $C_1$-$C_3$ alkyl groups, $C_1$-$C_3$ fluoroalkyl groups and carboxyl group are preferable. X is selected from the group consisting of direct bond, —CH$_2$—, —C(CH$_3$)$_2$—, —C(CF$_3$)$_2$—, —C(C$_2$F$_5$)$_2$—, —O—, —SO$_2$—, fluorene, —CO—, —COO—, —CONH—, —CF$_2$— and the above Formulae (3) wherein different Xs are optionally employed in combination. Among these direct bond, —C(CF$_3$)$_2$—, —O—, —SO$_2$— and fluorine are preferable. The p and q are integers of 0 to 3, s and t are integers of 0 to 4, and s+t>0; and w is an integer of 0 to 8.

The compound (a) having an imide structure represented by the Formula (1) used in the present invention can be obtained by reacting a diamine compound having a phenolic hydroxyl group, tetracarboxylic dianhydride and dicarboxylic anhydride having a carbon-carbon double bond, such as maleic anhydride or nadic anhydride. By introducing maleic anhydride, nadic anhydride or the like to the terminal, the solubility can be increased during the reaction with the diamine due to low molecular weight, while the reaction between double bonds in maleic anhydride, nadic anhydride or the like and the reaction with an amino group undergo during curing reaction of epoxy groups, thereby increasing the molecular weight of the compound having an imide structure. By this, the mechanical property can be improved.

Examples of the diamine compound having a phenolic hydroxyl group include 2,2-bis(3-amino-4-hydroxyphenyl)hexafluoropropane (6FAP, produced by AZ Electronic materials Inc.), 9,9-bis(3-amino-4-hydroxyphenyl)fluorene (BAHF, produced by AZ Electronic materials Inc.), 9,9-bis(4-amino-3-hydroxyphenyl)fluorene, dihydroxybenzidine, bis(3-amino-4-hydroxyphenyl)sulfone (ABPS, produced by AZ Electronic materials Inc.), bis(3-amino-4-hydroxyphenyl)ether (ADPE), bis(3-amino-4-hydroxyphenyl)propane, hydroxyphenylenediamine, dihydroxydiaminobenzene, bis(4-amino-3-hydroxyphenyl)sulfone, 2,2-bis(4-amino-3-hydroxyphenyl)hexafluoropropane, bis(aminophenoxy)hydroxybenzene, bis(3-amino-4-hydroxyphenoxy)benzene and bis(4-amino-3-hydroxyphenoxy)benzene.

Further, the epoxy resin composition may be modified with diamine compounds within the range of less than 50% of the diamine components, which diamine compounds do not have a phenolic hydroxyl group, including a diamine having one to four aromatic rings, such phenylenediamine, diaminodiphenylmethane, diaminodiphenylether, diaminodiphenylsulfone, diaminodiphenylpropane, bisaminophenoxybenzene, bisaminophenoxyphenylsulfone, bisaminophenoxyphenylpropane or bis(aminophenyl)fluorene; an aliphatic diamine compound such as ethylenediamine, diaminopropane, diaminobutane, diaminoheptane, diaminohexane, diaminocycloheptane, diaminocyclohexane, methylenebis(aminocyclohexane); and diaminobenzoic acid and bis(3-carboxy-4-aminophenyl)methane which have carboxyl groups.

Examples of the tetracarboxylic dianhydride include pyromellitic dianhydride, 3,3',4,4'-biphenyltetracarboxylic dianhydride, 2,2',3,3'-biphenyltetracarboxylic dianhydride, 2,3,3',4'-biphenyltetracarboxylic dianhydride, benzophenonetetracarboxylic dianhydride, diphenylethertetracarboxylic dianhydride, diphenylsulfonetetracarboxylic dianhydride, hexafluoroisopropylidene-bis(phthalic anhydride), phenylenebisoxybis(phthalic anhydride), bis(phenyltrimellitic anhydride), hydroquinone bis(trimellitic anhydride), (isopropylidenediphenoxy)bis(phthalic anhydride). Although high molecular weight compound may be obtained by reacting these tetracarboxylic dianhydrides, the solubility of such compounds may be decreased. Moreover, the benzene rings in these acid anhydrides are optionally substituted by one or more groups selected from the group consisting of hydroxyl group, $C_1$-$C_4$ alkyl groups, $C_1$-$C_4$ fluoroalkyl groups, $C_1$-$C_4$ alkoxyl groups, $C_1$-$C_4$ fluoroalkoxyl groups, $C_2$-$C_5$ ester groups, carboxyl group, cyano group and nitro group.

In view of the solubility in a ketone solvent (described below), the compound having an imide structure represented by the Formula (1) has a number average molecular weight of 1,000 to 5,000, preferably 1,000 to 4,000, and more preferably 1,000 to 3,000. The weight average molecular weight of the compound is preferably not more than 10,000. To raise the glass transition temperature, the weight average molecular weight is preferably not less than 1,000. Thus, the range of the weight average molecular weight is preferably 1,000 to 10,000, and more preferably 1,000 to 5,000.

Further, the compound having an imide bond and a carbon-carbon double bond at its terminal may be obtained by reacting a dicarboxylic anhydride having a carbon-carbon double bond, such as maleic anhydride, cyclohexenedicarboxylic anhydride, nadic anhydride, tetrahydrobenzo[3,4]cyclobuta[1,2,c]furan-1,3-dione, 8-oxatricyclo[4,3,1,0$^{2,5}$]dec-3-en-7, 9-dione, bicyclo[2,2,2]oct-5-en-dicarboxylic anhydride, octahydronaphtho[2,3-c]furan-1,3-dione to the terminal.

Generally, this reaction is carried out in a polar solvent having a high boiling point, such as N-methyl-2-pyrrolidone (NMP) or γ-butyrolactone. However, since the compound having an imide structure represented by the Formula (1) of the present invention is soluble in a solvent having a ketone group, the intended compound having an imide structure represented by the Formula (1) may be obtained by dissolving the diamine compound in a solvent such as cyclohexanone; and adding thereto a dicarboxylic anhydride having a carbon-carbon double bond, such as maleic anhydride or nadic anhydride, and tetracarboxylic dianhydride, to allow the reaction at a temperature of not less than 100° C. while evaporating off water. A base compound such as pyridin, triethylamine or isoquinolin; and an acid anhydride such as acetic anhydride may be added to the reaction as an imidization catalyst. As the imidization catalyst, an acid type or base type ion exchange resin may be used.

In cases where a solvent other than the ketone solvent is used, the intended compound having an imide structure represented by the Formula (1) is obtained after polymerization by evaporating the solvent by evaporator; or adding the reaction solution to water, alcohol or the like to allow the compound having an imide structure represented by the Formula (1) to precipitate as solid, collecting the solid by filtration, and washing and drying the collected solid. The replacement of the solvent may be carried out by adding a ketone solvent after evaporation.

In cases where the reaction is carried out by using the ketone solvent, the compound having an imide structure represented by the Formula (1) may be obtained as solid by the above-described method, and the compound in the form of solution may be mixed with the compound (b) having at least two epoxy groups.

Examples of the compound (b) having at least two epoxy groups used in the present invention include bisphenol A type (e.g. Trade Name: "jER (registered trademark)"828 produced by Mitsubishi Chemical Corporation), bisphenol F type (e.g. Trade Name: "jER (registered trademark)"807 produced by Mitsubishi Chemical Corporation), biphenyl type (e.g. Trade Name: "jER (registered trademark)" YX4000 produced by Mitsubishi Chemical Corporation), phenolic novolak type (e.g. Trade Name: "jER (registered trademark)"152 produced by Mitsubishi Chemical Corporation), cresol novolak type (e.g. Trade Name: "EPICLON (registered trademark)" N660 produced by DIC Corporation), glycidylamine type (e.g. Trade Name: "jER (registered trademark)"604 produced by Mitsubishi Chemical Corporation), cyclopentadiene type (e.g. Trade Name: "EPICLON (registered trademark)" HP7200 produced by DIC Corporation), naphthalene type (e.g. Trade Name: "EPICLON (registered trademark)" HP4032, "EPICLON" HP4710 produced by DIC Corporation) and alkyldiglycidylether type (e.g. Trade Name: YED216 produced by Mitsubishi Chemical Corporation), and mixtures of these may be used. To adjust the viscosity, a compound having a monovalent epoxy group (e.g. Trade Name: "jER (registered trademark)"801 produced by Mitsubishi Chemical Corporation) may be used as a mixture.

Examples of the compound (b) having at least two epoxy groups used in the present invention include bifunctional epoxy resins, trifunctional epoxy resins and multifunctional epoxy resins having four or more epoxy groups. Examples of the bifunctional epoxy resin include bisphenol A type epoxy resins, bisphenol F type epoxy resins, bisphenol S type epoxy resins, aliphatic glycidylether type epoxy resins, alicyclic glycidylether type epoxy resins, glycidylaniline type epoxy resins, cyclopentadiene type epoxy resins and naphthalene type epoxy resins. Examples of the trifunctional epoxy resin include epoxy resins having triazine skeleton, aminophenol type epoxy resins and aminocresol type epoxy resins. Examples of the multifunctional epoxy resin having four or more epoxy groups include cresol novolak type epoxy resins, phenolic novolak type epoxy resins, biphenyl type epoxy resins, naphthalene type epoxy resins and aromatic glycidylamine type epoxy resins.

Among these, the epoxy resins represented by the Formulae (6) to (8) are preferably used in that the epoxy equivalent is small, the crosslink density in the cured product is increased, and the low thermal expansibility and high thermal resistance are highly improved. Also, the epoxy resin represented by the Formula (9) is preferably used in that the rigidity and orientation of the cured product are enhanced, and the low thermal expansibility and high thermal resistance are highly improved.

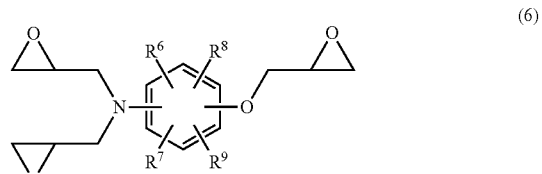

(6)

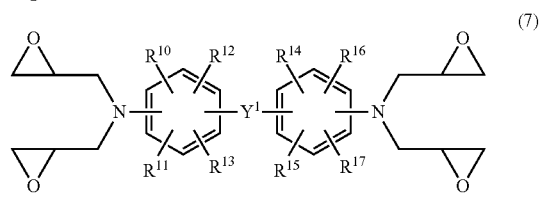

(7)

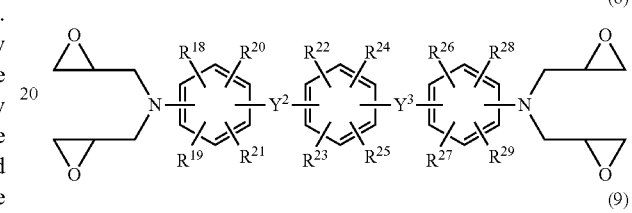

(8)

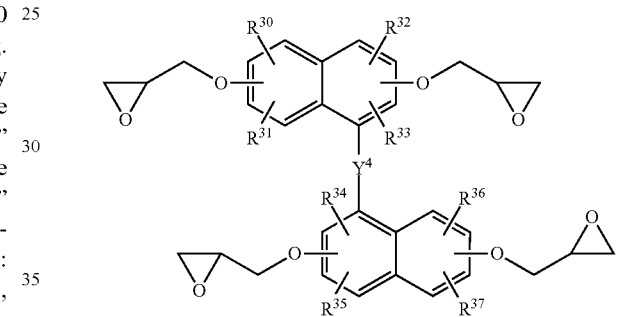

(9)

In the above Formulae (6) to (9), $R^6$ to $R^{37}$ are each independently selected from the group consisting of hydrogen atom, halogen atom, $C_1$-$C_6$ alkyl groups, $C_1$-$C_6$ alkoxyl groups, $C_1$-$C_6$ fluoroalkyl groups, cycloalkyl groups (preferably the carbon numbers are 6 to 8, and same also in the preferable cycloalkyl groups described below) and aryl groups (preferably the carbon numbers are 6 to 8, and same also in the preferable aryl groups described below) wherein these groups are optionally employed individually or different groups are optionally employed in combination as each of $R^6$ to $R^{37}$. Preferable examples of $R^6$ to $R^{37}$ include methyl group, ethyl group and propyl group, but $R^6$ to $R^{37}$ are not restricted thereto. $Y^1$ to $Y^4$ are each independently selected from the group consisting of direct bond, methylene group, ether group, thioether group, $SO_2$ group, isopropylene group and groups represented by the Formula (10) below wherein these groups are optionally employed individually or different groups are optionally employed in combination as each of $Y^1$ to $Y^4$. Among these, preferable examples of $Y^1$ to $Y^4$ include direct bond, methylene group and $SO_2$ group.

(10)

In the above Formula (10), $R^{38}$ and $R^{39}$ are each independently selected from the group consisting of hydrogen atom, halogen atom, $C_1$-$C_6$ alkyl groups, alkoxyl groups, fluoroalkyl groups, cycloalkyl groups and aryl groups wherein these groups are optionally employed individually or different groups are optionally employed in combination as each of $R^{38}$ and $R^{39}$. Among these, preferable $R^{38}$ and $R^{39}$ include methyl group, ethyl group and propyl group.

Specific examples of the aminophenol type epoxy compound represented by the above Formula (6) include triglycidyl compounds of p-aminophenol, m-aminophenol, p-aminocresol, trifluoromethylhydroxyaniline, hydroxyphenylaniline, methoxyhydroxyaniline, butylhydroxyaniline, hydroxynaphthylaniline and the like. Examples of commercially-available compound include ELM120, ELM100 (hereinbefore mentioned are Trade Names produced by Sumitomo Chemical Company, Limited), "Araldite (registered trademark)" MY0500, "Araldite" MY0510 (hereinbefore mentioned are Trade Names produced by Vantico Inc.) and "jER (registered trademark)" 630 (hereinbefore mentioned is Trade Name produced by Mitsubishi Chemical Corporation). These epoxy compounds have low viscosity and high density of epoxy groups in the compound, which are capable of increasing the crosslink density after curing and which are excellent in the thermal resistance after curing and the thermal expansibility.

Specific examples of the aromatic glycidylamine type epoxy compound represented by the above Formulae (7) and (8) include tetraglycidyl diaminodiphenylether, tetraglycidyl tetramethyldiaminodiphenylether, tetraglycidyl tetraethyldiaminodiphenylether, tetraglycidyl bis(aminophenoxyphenyl)propane, tetraglycidyl bis(aminophenoxyphenyl)sulfone, tetraglycidyl bis(trifluoromethyl)diaminobiphenyl, tetraglycidyl benzidine, tetraglycidyl trizine, tetraglycidyl-p-phenylenediamine, tetraglycidyl-m-phenylenediamine, tetraglycidyl diaminotoluene, tetraglycidyl diaminoxylene, tetraglycidyl diaminodiphenylsulfone, tetraglycidyl diaminodiphenylmethane, and 1:4 addition reaction product of α,α'-bis(4-aminophenyl)-1,4-diisopropylbenzene and epichlorohydrin. Examples of commercially-available compound include ELM434 (hereinbefore mentioned is Trade Name produced by Sumitomo Chemical Company, Limited), "Araldite (registered trademark)" MY720, "Araldite" MY721, "Araldite" MY722, "Araldite" MY9512, "Araldite" MY9612, "Araldite" MY9634, "Araldite" MY9663 (hereinbefore mentioned are Trade Names produced by Vantico Inc.), "jER (registered trademark)"604 (produced by Mitsubishi Chemical Corporation) and TGDAS (hereinbefore mentioned is Trade Name produced by Konishi Chemical Ind. Co., Ltd.). These epoxy compounds have good storage stability and high density of epoxy groups in the compound, which are capable of increasing the crosslink density after curing, and which are excellent in the thermal resistance after curing and the thermal expansibility.

The naphthalene type epoxy compound represented by the above Formula (9) may be prepared from a tetraglycidyl compound obtained through a tetravalent naphthol intermediate which is a condensation product of dihydroxynaphthalene and formaldehyde. Specific examples thereof include "EPICLON (registered trademark)" HP4700, "EPICLON" HP4710 and "EPICLON" HP4770 (hereinbefore mentioned are Trade Names produced by DIC Corporation). Since the rigidity and strong orientation of these epoxy resins are enhanced by naphthalene skeletons in the compound, the epoxy resins are excellent in thermal resistance after curing and thermal expansibility.

As for the equivalent of the epoxy group in the compound (b) having at least two epoxy groups, the same equivalent is preferably added as the total of the equivalent of the hydroxyl group in the compound (a) having an imide structure represented by the Formula (1) and the equivalent of functional groups (hydroxyl group, carboxyl group and cyano group) among the groups represented by $R^4$ and $R^5$ which react with epoxy groups. The equivalent of the epoxy means the mass of the resin containing 1 equivalent of epoxy group, and may be determined by dividing the molecular weight calculated from structural formula by the number of the epoxy groups contained in the structure. Alternatively, the equivalent of the epoxy may also be determined by potentiometric titration in accordance with JIS-K7236 (2001)•ISO3001.

Since the hydroxyl group in the compound (a) having an imide structure represented by the Formula (1) and the functional groups represented by $R^4$ and $R^5$ in the Formula (2), which react with the epoxy groups at a ratio of 1:1, the ratio of the equivalent of the functional groups which react with epoxy groups and the equivalent of the epoxy group is preferably 0.7 to 1.2:1, and more preferably 0.9 to 1.1:1.

In cases where the ratio of the equivalent of the hydroxyl group in the compound (a) having an imide structure represented by the Formula (1) and the functional groups represented by $R^4$ and $R^5$ in the Formula (2), which react with the epoxy groups, and the equivalent of the epoxy group is 0.7 to 1.2:1, the reaction between epoxy groups does not undergo so much, a decrease in the glass transition temperature and chemical resistance hardly occur, and the amount of unreacted other curing agent or hardening accelerator is small, so that an increase in percentage of water absorption and a decrease in chemical resistance hardly occur.

Although the compound (b) having at least two epoxy groups acts as a curing agent of the compound (a) having an imide structure represented by the Formula (1), other curing agents or hardening accelerators may be contained in the epoxy resin composition of the present invention in order to accelerate the curing reaction by the compound (b) having at least two epoxy groups. Here, the curing agent means one having a curing action individually, and the hardening accelerator means one having an action to accelerate the reaction by using it with the curing agent.

As the other curing agents and hardening accelerators, novolak resins, phenol resins, aliphatic polyamines, alicyclic polyamines and aromatic polyamines are preferably used. Examples of the aliphatic polyamine include diethyltriamine, triethylenetetramine and xylenediamine; examples of the alicyclic polyamine include isophoronediamine, 1,3-bisaminomethylcyclohexane and norbornenediamine; and examples of the aromatic polyamine include metaphenylenediamine, diaminodiphenylmethane and diaminodiphenylsulfone.

The curing agents are preferably added in the same equivalent as that of the epoxy groups in the compound (b) having at least two epoxy groups. The hydroxyl group (OH) in the other curing agents and hardening accelerators reacts with the epoxy group at a ratio of 1:1, and the amino group ($NH_2$) in the other curing agents and hardening accelerators reacts with the epoxy group at a ratio of 1:2. Therefore, the ratio of the equivalent of the reaction groups in the other curing agents and the equivalent of the epoxy groups is preferably 0.7 to 1.2:1, and more preferably 0.9 to 1.1:1. In cases where the ratio of the equivalent of the reaction groups in the other curing agents and the equivalent of the epoxy groups is 0.7 to 1.2:1, the reaction between epoxy groups does not undergo so much, and a decrease in the glass transition temperature and chemical resistance hardly occur; and the amount of unreacted other curing agents or hardening accelerators is small, so that an increase in percentage of water absorption and a decrease in chemical resistance hardly occur.

Examples of the other curing agents or hardening accelerators which may be used in the epoxy resin composition of the present invention also include acid anhydrides, dicyandiamides and the derivatives thereof, imidazoles and the derivatives thereof, condensation product of amine derivatives and formaldehyde (urea-formaldehyde, melamine-formaldehyde), organometallic complexes, polythiols and onium salts, and two or more kinds of them may be used.

Specific examples of the acid anhydride include succinic anhydride, itaconic anhydride, phthalic anhydride, pyromellitic dianhydride, benzophenonetetracarboxylic dianhydride, biphenyltetracarboxylic dianhydride, hexahydrophthalic anhydride, methyltetrahydrophthalic anhydride, "ADEKA HARDENER (registered trademark)" EH-3326, "ADEKA HARDENER" EH-703, "ADEKA HARDENER" EH-705A (hereinbefore mentioned are Trade Names produced by ASAHI DENKA Co., Ltd.), "EPICLON" B-570, "EPICLON" B-650 (hereinbefore mentioned are Trade Names produced by DIC Corporation) and "RIKACID (registered trademark)" MH-700 (Trade Name produced by New Japan Chemical Co., Ltd.). Examples of the dicyandiamide and the derivatives thereof include DICY7, DICY15 and DICY50 (hereinbefore mentioned are Trade Names produced by Mitsubishi Chemical Corporation) and "AJICURE (registered trademark)" AH-154, "AJICURE" AH-162 (hereinbefore mentioned are Trade Names produced by Ajinomoto Fine-Techno Co., Inc.). Examples of the imidazoles and the derivatives thereof include imidazole, 2-methylimidazole, 2-undecylimidazole, 2-ethyl-4-methylimidazole, 2-phenyl-4-methylimidazole, 2-phenyl-4-methyl-5-hydroxyimidazole, 2-phenylimidazole, 1-benzyl-2-methylimidazole, 1-benzyl-2-phenylimidazole, 1-cyanoethyl-2-methylimidazole, 1-cyanoethyl-2-ethyl-4-methylimidazole, 1-cyanoethyl-2-phenylimidazole, 1-cyanoethyl-2-phenylimidazolium trimellitate, and imidazole silanes such as IS-1000, IS-1000D, IM-1000, SP-1000, IA-100A, IA-100P and IA-100F (hereinbefore mentioned are Trade Names produced by Nikko Materials Co., Ltd.). Examples of the condensation product of amine derivatives and formaldehyde (urea-formaldehyde, melamine-formaldehyde) include 4-chloro-phenyl-N,N-dimethyl urea and 3,4-dichlorophenyl-N,N-dimethyl urea (DCMU). Examples of the organometallic complex include triphenylphosphine and triphenylphosphonium triphenylborate; and examples of the polythiols include aliphatic polythioethers, aliphatic polythioesters and aromatic ring-containing poly thioethers. Examples of the onium salt include onium salts such as sulfonium and iodonium; onium salt type diphenyliodonium hexafluorophosphate, triphenylsulfonium hexafluorophosphate, CYRACURE UVI-6992, CYRACURE UVI-6974 (hereinbefore mentioned are Trade Names produced by Dow Chemical Japan Ltd.), Adekaoptomer SP150, Adekaoptomer SP170 (hereinbefore mentioned are Trade Names produced by ASAHI DENKA Co., Ltd.), and San-AidSI-60L, SI-80L, SI-100L and SI-150L (hereinbefore mentioned are Trade Names produced by Sanshin Chemical Industry Co., Ltd.).

In addition thereto, examples of the curing agent which can be stored for a long time in the form of a mixture with the epoxy compound, and which initiates the curing reaction by stimulations such as heat, light, pressure and moisture, include microcapsule-type latent curing agents and amine adduct type latent curing agents. The microcapsule type latent curing agent is an agent having core (core substrate)/shell (capsule membrane) structure, and examples of the core include various imidazole compounds and triphenylphosphine; and examples of the shell include organic polymers and inorganic compounds. Specific examples thereof include "Novacure (registered trademark)" HX-3941HP, "Novacure" HXA3922HP, "Novacure" HXA3932HP and "Novacure" HXA3042HP (hereinbefore mentioned are Trade Names produced by Asahi Kasei Chemicals Corp.). The amine adduct type latent curing agent is an agent obtained by reacting an imidazole compound, tertiary amino group-containing compound or hydrazide compound with an epoxy compound, isocyanate compound or the like to increase the molecular weight, and pulverizing the resultant, which has low solubility at normal temperature and shows latency. Specific examples thereof include "AJICURE" PN-23, "AJICURE" PN-40, "AJICURE" MY-24, "AJICURE" MY-H (hereinbefore mentioned are Trade Names produced by Ajinomoto Fine-Techno Co., Inc.), "Fujicure (registered trademark)" FXR-1030 (Trade Name, produced by FUJI KASEI CO., LTD.) "AJICURE" VDH and "AJICURE" UDH (hereinbefore mentioned are Trade Names produced by Ajinomoto Fine-Techno Co., Inc.).

The content of the other curing agents and hardening accelerators is preferably 0.1 to 60 parts by weight, and more preferably 10 to 50 parts by weight with respect to 100 parts by weight of the compound (b) having at least two epoxy groups. When the content of the other curing agents and hardening accelerators is not less than 0.1 parts by weight, the curing of the compound (b) having at least two epoxy groups can be carried out effectively, and when the content is not more than 60 parts by weight, initiation of the reaction at room temperature can be suppressed.

Furthermore, an oxetane compound other than the compound (b) having at least two epoxy groups may be contained. In cases where the oxetane compound is contained, thermal stability is increased, thereby improving the thermal resistance after curing. Among these oxetane compounds, examples of monofunctional oxetane compounds include "ETERNACOLL (registered trademark)" EHO, "ETERNACOLL" OXMA, (hereinbefore mentioned are Trade Names produced by Ube Industries. LTD.), OXT-101, OXT-211, OXT-212, OXT-610 (hereinbefore mentioned are Trade Names produced by Toagosei Co., Ltd.) and 3-ethyl-3-(cyclohexyloxy)methyloxetane; examples of bifunctional oxetane compounds include "ETERNACOLL" OXBP, "ETERNACOLL" OXTP, "ETERNACOLL" OXIPA (hereinbefore mentioned are Trade Names produced by Ube Industries. LTD.), OXT-121, OXT-221 (hereinbefore mentioned are Trade Names produced by Toagosei Co., Ltd.); and examples of trifunctional oxetane compounds include oxetanylated phenol resins, oxetanyl silicates and phenolic novolak type oxetane compounds. Two or more kinds of these may be contained. The content of the oxetane compound is preferably 0.1 to 60 parts by weight with respect to 100 parts by weight of the compound (b) having at least two epoxy groups. When the content of the oxetane compound is not less than 0.1 parts by weight, the thermal resistance of the epoxy resin composition can be increased, and when the content is not more than 60 parts by weight, layer separation of the cured product can be prevented.

The epoxy resin composition of the present invention is preferably dissolved in cyclohexanone (c) at a concentration of not less than 30% by weight. By this, the epoxy resin composition is capable of being compatible with many epoxy resins easily, drying thereafter can be carried out simply, and shrinkage during the curing is decreased.

As long as the epoxy resin composition of the present invention is soluble in cyclohexanone (c) at a concentration of not less than 30% by weight, solvents having a ketone group other than cyclohexanone, such as acetone, acetonyl acetone, diisobutyl ketone, diethyl ketone, dipropyl ketone, methyl amyl ketone, methylcyclohexanone, ethylcyclohexanone, methyl dipropyl ketone, methyl propyl ketone, mesityl oxide, methyl ethyl ketone, methyl isobutyl ketone and cyclopentanone, may be used as a reaction solvent. In addition to cyclohexanone (c) and the above-described solvents having a ketone group other than cyclohexanone, ether solvents such as 1,4-dioxan, tetrahydrofuran, glycidol and diglyme; glycol ether solvents such as methyl cellosolve, ethyl cellosolve, propylene glycol monomethyl ether, propylene glycol monoethyl ether, propylene glycol monobutyl ether, diethylene glycol methyl ethyl ether; benzylalcohol, propanol, N-methylpyrrolidone, γ-butyrolactone, ethyl acetate, N,N-dimethylformamide and the like may be used in the mixture of the reaction solvent within the range of not more than 50% by weight of total solvents. Also, two or more kinds of these may be mixed.

The epoxy resin composition of the present invention may contain cyclohexanone and/or solvents having a ketone group other than cyclohexanone in an amount of 0.1 to 1% by weight in order to adjust viscosity and improve coating property. In cases where the content of the solvents is 0.1 to 1% by weight, formation of voids caused by evaporation of the solvents during heat treatment can be suppressed, and excellent storage stability can be attained without agglutinating the particles of the compound having an imide structure represented by the Formula (1).

The epoxy resin composition of the present invention may contain at least one inorganic particles (d) selected from the group consisting of boron nitride, silica, titania, zirconia, silicon nitride, alumina, ceria, talc, calcium carbonate and silica-titania composite particles. These inorganic particles contained therein can give thermal conductivity and reduce coefficient of thermal linear expansion of the cured film. In cases where thermal conductivity is given, boron nitride, silica, titania, alumina, calcium carbonate and silica-titania composite particles are preferable. Further, to bind the inorganic particles and matrix resin at the interface therebetween, the inorganic particles which surfaces are treated with various coupling agents such as silane type, titanium type and aluminium type; aliphatic acid, phosphoric ester and the like, or which are subjected to rosin treatment, acid treatment and/or base treatment are suitably used. A silane coupling agent which is a silane-based coupling agent is preferable due to increasing affinity with the epoxy compound, and in particular, a silane coupling agent having an epoxy group is preferably used from the viewpoint of increasing strength. Preferable examples of the silane coupling agent include γ-glycidoxytrimethoxy silane, γ-glycidoxytriethoxy silane, γ-glycidoxytripropoxy silane, 2-(3,4-epoxycyclohexyl)ethyltrimethoxy silane, 2-(3,4-epoxycyclohexyl)ethyltriethoxy silane, 2-(3,4-epoxycyclohexyl)ethyltripropoxy silane, 3-aminopropyltrimethoxy silane, 3-aminopropyltriethoxy silane and 3-aminopropyltripropoxy silane. Two or more kinds of these may be used.

The content of the inorganic particles (d) is preferably 5 to 5,000 parts by weight with respect to 100 parts by weight of the compound (b) having at least two epoxy groups. In cases where the content of the inorganic particles is not less than 5 parts by weight, the coefficient of thermal linear expansion may be reduced, and in cases where the content of the inorganic particles is not more than 5,000 parts by weight, the adhesive property and mechanical characteristic of the epoxy resin composition may be maintained. More preferably, the content of the inorganic particles is 30 to 500 parts by weight with respect to 100 parts by weight of the total of the component (a), which is the compound having an imide group and the component (b), which is the epoxy compound.

The average particle size of the inorganic particles is preferably 5 nm to 30 μm, and more preferably 10 nm to 10 μm. Here, the average particle size in the present invention is determined by preparing a coating film having a thickness of 20 μm by the ultrathin cutting method, observing the cross section of the coating film with a transmission electron microscope (H-7100FA type produced by Hitachi, Ltd.) at an acceleration voltage of 100 kV and at a magnification of ×200,000, measuring the particle size of each particle for arbitrarily selected 50 particles from the obtained image and calculating the mean of the particle sizes. In cases where the particle size is not less than 5 nm, appropriate viscosity may be given, and at the same time, stable particle dispersibility may be attained. In cases where the particle size is not more than 30 μm, low viscosity may be improved, and sedimentation of the inorganic particles may be prevented.

The epoxy resin composition of the present invention may contain at least one organic particles (e) selected from the group consisting of polyimides, polyamides, polyamideimides, polystyrenes, polyacrylonitriles, polyphenylenethers, polyesters and polycarbonates. The organic particles contained therein can give toughness, thermal resistance and low moisture absorption. The content of the organic particles is preferably 5 to 1,000 parts by weight with respect to 100 parts by weight of the compound (b) having at least two epoxy groups. In cases where the content is not less than 5 parts by weight, toughness, thermal resistance and mechanical characteristic are improved, and in cases where the content is not more than 1,000 parts by weight, mechanical characteristic can be maintained, and the viscosity of the solution is not increased too high.

The average particle size of the organic particles is preferably 5 nm to 10 μm, and more preferably 5 nm to 5 μm. The measurement method of the average particle size of the organic particles is the same as the above-described measurement method of the average particle size of the inorganic particles.

In addition thereto, phenoxy resins, polyurethanes, polypropylenes, acrylonitrile-butadiene copolymers (NBR), styrene-butadiene copolymers (SBR), acrylonitrile-butadiene-methacrylic acid copolymers, acrylonitrile-butadiene-acrylic acid copolymers and the like may be contained.

Moreover, the epoxy resin composition of the present invention may contain nonionic, cationic or anionic surfactants, wetting agents such as polycarboxylic acids, amphipathic substances, resins having substituents with high steric hindrance and the like. As necessary, stabilizing agents, dispersing agents, suspension stabilizers, plasticizers, antioxidants and the like may be contained.

The epoxy resin composition of the present invention can be obtained, for example, by mixing a diamine having a structure represented by the Formula (2)' below in an amount of not less than 50% by mole, one or more tetracarboxylic dianhydrides selected from the Formulae (4)' below, and one or more compounds selected from the Formulae (5)' below in a solvent (c)' having a ketone group under the condition of 50 to 80° C. for 0.5 to 2 hours to obtain a compound (a) having an imide structure represented by the Formula (1); and mixing the compound (a) with a compound (b) having at least two epoxy groups.

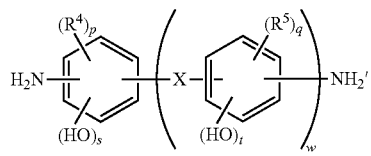

(2)

(wherein $R^4$ and $R^5$ are each independently selected from the group consisting of $C_1$-$C_4$ alkyl groups, $C_1$-$C_4$ fluoroalkyl groups, $C_1$-$C_4$ alkoxyl groups, $C_1$-$C_4$ fluoroalkoxyl groups, $C_2$-$C_5$ ester groups, carboxyl group, cyano group and nitro group wherein these groups are optionally employed individually or different groups are optionally employed in combination as each of $R^4$ and $R^5$; X is selected from the group consisting of direct bond, —$CH_2$—, —$C(CH_3)_2$—, —$C(CF_3)_2$—, —$C(C_2F_5)_2$—, —O—, —$SO_2$—, fluorene, —CO—, —COO—, —CONH—, —$CF_2$— and the Formula (3) below wherein different Xs are optionally employed in combination; p and q are integers of 0 to 3, s and t are integers of 0 to 4, and s+t>0; and w is an integer of 0 to 8)

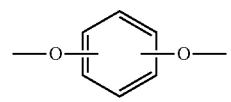

(3)

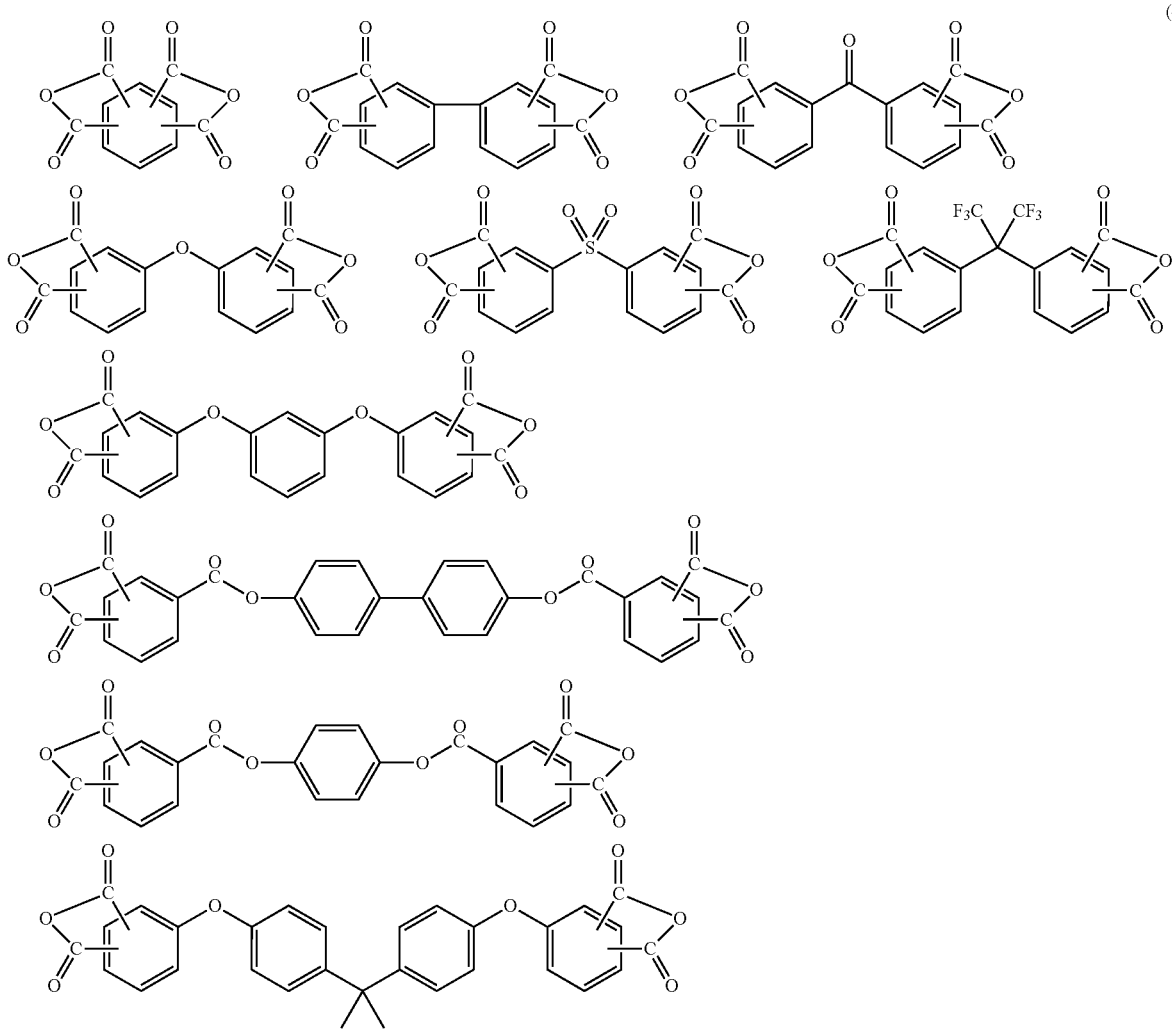

(4')

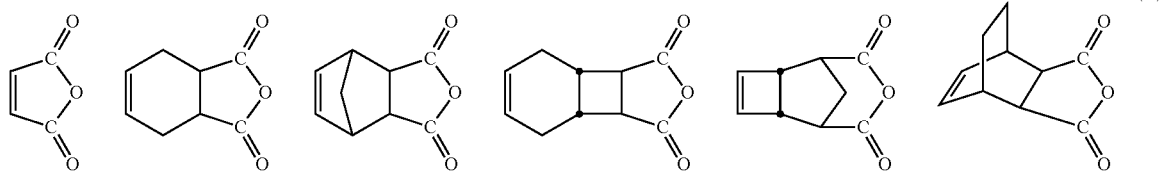

(5')

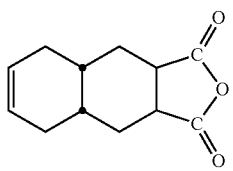

Preferable examples of one represented by each symbol in Formula (2)' are the same as the examples described for the above-described Formula (2).

The organic/inorganic particles, curing agents, hardening accelerators and the like may be mixed in the same way. In particular, in cases where the organic/inorganic particles are mixed, the methods for suspending the particles by using ultrasonic dispersion, ball mill, roll mill, kneader, Clearmix, homogenizer, media disperser and the like are exemplified. The mixing of the epoxy resin composition is carried out preferably at not more than 80° C., and more preferably at not more than 40° C. The mixing is carried out at preferably at not less than 0° C., and more preferably at not less than 10° C. By carrying out the mixing at not less than 0° C. and not more than 80° C., the epoxy resin composition has adequate viscosity and sufficient stirring can be carried out.

Since the compound (a) having an imide structure represented by the Formula (1) can be obtained by the reaction in a ketone solvent (for example, cyclohexanone), the compound (b) having at least two epoxy groups may be mixed with the solution obtained after the reaction.

The epoxy resin composition of the present invention is preferably employed as an adhesive (underfill agent) for bonding semiconductor elements and substrates. In addition thereto, the film obtained by curing the thermosetting resin composition of the present invention may be applied to uses such as over-coats of semiconductor elements, interlayer insulation films of multilayer wirings for high density packing and insulation films for protecting wirings of the circuit board. From these, semiconductor devices may be obtained.

EXAMPLE

The present invention will now be described below by way of Examples, but the present invention is not restricted by the examples. The evaluation in the Examples was carried out by the following method.
(1) Hydroxyl Equivalent
(1-1) In Case of Using End Cap Compound
The hydroxyl equivalent was determined according to the following equation by using the molecular weight, the number of hydroxyl group and molar ratio of each diamine component, acid component and end cap compound used in each Example and Comparative Example. The molar ratio of each component was calculated by taking the molar ratio of the end cap compound as 2.

Hydroxyl equivalent (g/eq)=(($Mwb \times Mb + Mwa \times Ma + Mwe \times 2$)−($Mb+Ma+2-1$)×18)/($OHb+OHa+OHe$)

In the above equation, Mwb represents the molecular weight of the diamine component, Mwa represents the molecular weight of the acid component, and Mwe represents the molecular weight of the end cap compound. OHb represents the number of the hydroxyl group in the diamine component, OHa represents the number of the hydroxyl group in the acid component, and OHe represents the number of the hydroxyl group in the end cap compound. Mb represents the molar ratio of the diamine component taking the molar ratio of the end cap compound as 2, and Ma represents the molar ratio of the acid component taking the molar ratio of the end cap compound as 2 as well.
(1-2) In Case of Using Diamine Component Alone
The hydroxyl equivalent was determined according to the following equation.

The hydroxyl equivalent (g/eq)=$Mwb$/OH$b$ (1-3) In Case of Using Acid Component Alone
The hydroxyl equivalent was determined according to the following equation.

The hydroxyl equivalent (g/eq)=$Mwa$/OH$a$ (2) Mean of v in Formula (1)
The mean was determined according to the following equation by using the molar ratio of each diamine component, acid component and end cap compound used in each Example and Comparative Example. The molar ratio of each component was calculated taking the molar ratio of the end cap compound as 2.

The mean of $v$ in the Formula (1)=($Mb/(Mb-Ma)$)−1

In the above equation, Mb represents the molar ratio of the diamine component taking the molar ratio of the end cap compound as 2, and Ma represents the molar ratio of the acid component taking the molar ratio of the end cap compound as 2
(3) Number Average Molecular Weight
The number average molecular weight was measured based on polystyrene with gel permeation chromatography (Waters 2690 produced by Waters Corporation). The TOSOH TXK-GEL α-2500 and α-4000 produced by Tosoh Corporation were used as columns, and NMP was used for a mobile phase.
(4) Solubility in Cyclohexanone
The epoxy resin composition was mixed with cyclohexanone to a solid concentration of 30% by weight, and whether the composition is dissolved or not was observed visually. The case where the composition was completely dissolved was evaluated as ○, and the case where the composition was not completely dissolved was evaluated as x
(5) Glass Transition Temperature
To the epoxy resin composition, NMP was added to a solid concentration of 70% by weight to prepare a solution, and a silicon wafer was coated with the solution by the spin coat method. Then the coated silicon wafer was baked with a hot plate (SKW-636 produced by Dainippon Screen Mfg. Co., Ltd.) at 120° C. for three minutes to prepare the prebaked film having a thickness of 10 μm±1 μm. The film was placed in an inert oven (INH-21 CD produced by Koyo Thermo Systems Co., Ltd.), the temperature was raised to the curing temperature of 170° C. over 80 minutes, and heat treatment was conducted at 170° C. for 120 minutes. Thereafter, the temperature in the oven was cooled slowly to not more than 50° C. to obtain cured film. Next, after immersing the obtained cured film on the silicon wafer in 47% by weight of hydrofluoric acid at room temperature for 7 minutes, the cured film was washed with tap water and peeled from the silicon wafer carefully so as not to break the film.

The cured film in an amount of 10 mg obtained by the above-described method was placed in an aluminium cell, and the cell was sealed, which cell was used as a test sample. Using a differential scanning calorimeter DSC-50 (produced by Shimadzu Corporation), the sample was heated to 300° C. at a temperature rising rate of 5° C./min under the condition of nitrogen flow rate of 20 ml/min, and after anneal treatment, the sample was cooled, and heated again in the temperature range from 30° C. to 300° C. at a temperature rising rate of 20° C./min to measure the glass transition temperature. The temperature at the minimum point of dDSC/dt was defined as the glass transition temperature.

(6) Measurement of Coefficient of Thermal Expansion

To the epoxy resin composition, NMP was added to a solid concentration of 70% by weight to prepare a solution, and the solution was applied by the spin coat method. Then the resultant was baked with a hot plate (SKW-636 produced by Dainippon Screen Mfg. Co., Ltd.) at 120° C. for three minutes to prepare a prebaked film having a thickness of 10 μm±1 μm. The film was placed in an inert oven (INH-21CD produced by Koyo Thermo Systems Co., Ltd.), the temperature was raised to the curing temperature of 170° C. over 30 minutes, and heat treatment was conducted at 170° C. for 120 minutes. Then, the temperature in the oven was cooled slowly to not more than 50° C. to obtain cured film. Next, after immersing the obtained cured film on the silicon wafer in 47% of hydrofluoric acid at room temperature for 7 minutes, the cured film was washed with tap water and peeled from the silicon wafer carefully so as not to break the film.

The cured film obtained by the above-described method was cut out to a size of 3 mm×17 mm, and the elongation of the cured film was measured by using thermomechanical analyzer SS-6100 (produced by Seiko Instruments Inc.) under conditions of tensile mode, temperature range of 25 to 150° C., temperature rising rate of 5° C./min, initial load of 0.5 g and chuck distance of 15 mm. The average coefficient of thermal linear expansion at 25 to 150° C. was calculated by the following equation from the obtained measurement results, wherein $L_{25}$ represents the sample length at 25° C., and $L_{150}$ represents the sample length at 150° C.

The average coefficient of thermal linear expansion=
$(1/L_{25})[(L_{150}-L_{25})/(150-25)]$ (7) Measurement of Viscosity To the epoxy resin composition, NMP was added to a solid concentration of 70% by weight to prepare a solution, 1 ml of the solution was weighted, and the viscosity of the solution was measured at 25° C. with E type viscometer produced by Tokimec Inc. In cases where the viscosity is higher than 1000 mPa·s, the workability is reduced.

Synthesis Example 1

Synthesis of Compound A Having Imide Structure (Examples 1, 10 to 13) (See Table 1 for the Structure of Each Compound)

In a three-necked 500 mL flask equipped with a nitrogen-introducing tube, an agitator and a thermometer, 36.6 g (100 mmol) of 2,2-bis(3-amino-4-hydroxyphenyl)hexafluoropropane (hereinafter referred to as 6FAP, produced by AZ Materials Co., Ltd.) as a diamine component was dissolved in 100 g of cyclohexanone (produced by Wako Pure Chemical Industries, Ltd.) under dry nitrogen gas flow. Pyromellitic dianhydride (hereinafter referred to as PMDA, produced by Daicel Industry Co., Ltd.) as an acid component in an amount of 10.9 g (50 mmol) was added thereto, and the resultant was stirred at 60° C. for 1 hour. Thereafter, 9.8 g (100 mmol) of maleic anhydride (hereinafter referred to as MA, produced by Wako Pure Chemical Industries, Ltd.) as an end cap compound was added with 35 g of cyclohexanone thereto, the resulting solution was stirred at 60° C. for 1 hour, and after raising the temperature of the solution to 160° C., the resultant was reacted for 6 hours while evaporating the formed water and properly adding cyclohexanone thereto. Then, the solution was cooled, and cyclohexanone was added thereto such that the content of the compound A having an imide structure in the solution was 30% by weight.

Synthesis Example 2

Synthesis of Compound B Having Imide Structure (Example 2)

In a three-necked 500 mL flask equipped with a nitrogen-introducing tube, an agitator and a thermometer, 36.6 g (100 mmol) of 6FAP as a diamine component was dissolved in 120 g of cyclohexanone under dry nitrogen gas flow. PMDA as an acid component in an amount of 16.4 g (75 mmol) was added thereto, and the resultant was stirred at 60° C. for 1 hour. Thereafter, 4.9 g (50 mmol) of MA as an end cap compound was added with 15 g of cyclohexanone thereto, the resulting solution was stirred at 60° C. for 1 hour, and after raising the temperature of the solution to 160° C., the resultant was reacted for 6 hours while evaporating the formed water and properly adding cyclohexanone thereto. Then, the solution was cooled, and cyclohexanone was added thereto such that the content of the compound B having an imide structure in the solution was 30% by weight.

Synthesis Example 3

Synthesis of Compound C Having Imide Structure (Example 3)

In a three-necked 500 mL flask equipped with a nitrogen-introducing tube, an agitator and a thermometer, 36.6 g (100 mmol) of 6FAP as a diamine component was dissolved in 120 g of cyclohexanone under dry nitrogen gas flow. 2,3,3',4'-Biphenyltetracarboxylic dianhydride (BPDA, produced by Linchuan Chemical Co., Ltd.) as an acid component in an amount of 14.7 g (55 mmol) was added thereto, and the resultant was stirred at 60° C. for 1 hour. Thereafter, 8.8 g (90 mmol) of MA as an end cap compound was added with 15 g of cyclohexanone thereto, the resulting solution was stirred at 60° C. for 1 hour, and after raising the temperature of the solution to 160° C., the resultant was reacted for 6 hours while evaporating the formed water and properly adding cyclohexanone thereto.

Then, the solution was cooled, and cyclohexanone was added thereto such that the content of the compound C having an imide structure in the solution was 30% by weight.

Synthesis Example 4

Synthesis of Compound D Having Imide Structure (Example 4)

In a three-necked 500 mL flask equipped with a nitrogen-introducing tube, an agitator and a thermometer, 28.0 g (100 mmol) of bis(3-amino-4-hydroxyphenyl)sulfone (ABPS, produced by AZ Materials Co., Ltd.) as a diamine component was dissolved in 160 g of cyclohexanone under dry nitrogen gas flow. Hexafluoropropylidene-bis(phtalic anhydride) (hereinafter referred to as 6FDA, produced by DAIKIN INDUSTRIES, LTD) as an acid component in an amount of 22.2 g (50 mmol) and 16.4 g (100 mmol) of nadic anhydride (hereinafter referred to as NA, produced by Tokyo Chemical Industry Co., Ltd.) as an end cap compound were added thereto, and the resultant was stirred at 60° C. for 1 hour. Thereafter, the temperature of the solution was raised to 160° C., and the resultant was reacted for 6 hours while evaporating the formed water and properly adding cyclohexanone thereto.

Then, the solution was cooled, and cyclohexanone was added thereto such that the content of the compound D having an imide structure in the solution was 30% by weight.

Synthesis Example 5

Synthesis of Compound E Having Imide Structure
(Example 5)

In a three-necked 500 mL flask equipped with a nitrogen-introducing tube, an agitator and a thermometer, 23.2 g (100 mmol) of bis(3-amino-4-hydroxyphenyl)ether (ADPE, produced by AZ Materials Co., Ltd.) as a diamine component was dissolved in 150 g of cyclohexanone under dry nitrogen gas flow. 6FDA as an acid component in an amount of 22.2 g (50 mmol) and 9.8 g (100 mmol) of MA as an end cap compound were added thereto, and the resultant was stirred at 60° C. for 1 hour. Thereafter, the temperature of the solution was raised to 160° C., and the resultant was reacted for 6 hours while evaporating the formed water and properly adding cyclohexanone thereto.

Then, the solution was cooled, and cyclohexanone was added thereto such that the content of the compound E having an imide structure in the solution was 30% by weight.

Synthesis Example 6

Synthesis of Compound F Having Imide Structure
(Example 6)

In a three-necked 500 mL flask equipped with a nitrogen-introducing tube, an agitator and a thermometer, 36.6 g (100 mmol) of 6FAP as a diamine component was dissolved in 160 g of cyclohexanone under dry nitrogen gas flow. PMDA as an acid component in an amount of 10.9 g (50 mmol) and 16.4 g (100 mmol) of NA as an end cap compound were added thereto, and the resultant was stirred at 60° C. for 1 hour. Thereafter, the temperature of the solution was raised to 160° C., and the resultant was reacted for 6 hours while evaporating the formed water and properly adding cyclohexanone.

Then, the solution was cooled, and cyclohexanone was added thereto such that the content of the compound F having an imide structure in the solution was 30% by weight.

Synthesis Example 7

Synthesis of Compound G Having Imide Structure
(Example 7)

In a three-necked 500 mL flask equipped with a nitrogen-introducing tube, an agitator and a thermometer, 38.0 g (100 mmol) of 9,9-bis(3-amino-4-hydroxyphenyl)fluorene (hereinafter referred to as BAHF (FL), produced by JFE Chemical Corporation) as a diamine component was dissolved in 160 g of cyclohexanone under dry nitrogen gas flow. PMDA as an acid component in an amount of 10.9 g (50 mmol) and 9.8 g (100 mmol) of MA as an end cap compound were added thereto, and the resultant was stirred at 60° C. for 1 hour. Thereafter, the temperature of the solution was raised to 160° C., and the resultant was reacted for 6 hours while evaporating the formed water and properly adding cyclohexanone thereto.

Then, the solution was cooled, and cyclohexanone was added thereto such that the content of the compound G having an imide structure in the solution was 30% by weight.

Synthesis Example 8

Synthesis of Compound H Having Imide Structure
(Example 8)

In a three-necked 500 mL flask equipped with a nitrogen-introducing tube, an agitator and a thermometer, 38.0 g (100 mmol) of BAHF (FL) as a diamine component was dissolved in 160 g of cyclohexanone under dry nitrogen gas flow. (Isopropylidenediphenoxy)-bis(phthalic anhydride) (hereinafter referred to as BSAA, produced by SABIC Innovative Plastics Japan, Ltd.) as an acid component in an amount of 26.0 g (50 mmol) and 9.8 g (100 mmol) of MA as an end cap compound were added thereto, and the resultant was stirred at 60° C. for 1 hour. Thereafter, the temperature of the solution was raised to 160° C., and the resultant was reacted for 6 hours while evaporating the formed water and properly adding cyclohexanone thereto.

Then, the solution was cooled, and cyclohexanone was added thereto such that the content of the compound H having an imide structure in the solution was 30% by weight.

Synthesis Example 9

Synthesis of Compound I Having Imide Structure
(Example 9)

In a three-necked 500 mL flask equipped with a nitrogen-introducing tube, an agitator and a thermometer, 10.0 g (50 mmol) of 4,4-diaminodiphenylether (DAE, produced by Tokyo Chemical Industry Co., Ltd.) and 76.0 g (200 mmol) of BAHF (FL) as diamine components were dissolved in 160 g of cyclohexanone under dry nitrogen gas flow. BSAA as an acid component in an amount of 104.1 g (200 mmol) and 9.8 g (100 mmol) of MA as an end cap compound were added thereto, and the resultant was stirred at 60° C. for 1 hour. Thereafter, the temperature of the solution was raised to 160° C., and the resultant was reacted for 6 hours while evaporating the formed water and properly adding cyclohexanone thereto.

Then, the solution was cooled, and cyclohexanone was added thereto such that the content of the compound I having an imide structure in the solution was 30% by weight.

Synthesis Example 10

Synthesis of Compound J Having Imide Structure
(Comparative Example 1)

In a three-necked 500 mL flask equipped with a nitrogen-introducing tube, an agitator and a thermometer, 36.6 g (100 mmol) of 6FAP as a diamine component was dissolved in 100 g of cyclohexanone under dry nitrogen gas flow. MA as an end cap compound in an amount of 19.6 g (200 mmol) was added with 35 g of cyclohexanone thereto, and the resultant was stirred at 60° C. for 1 hour. Thereafter, the temperature of the solution was raised to 160° C., and the resultant was reacted for 6 hours while evaporating the formed water and properly adding cyclohexanone thereto.

Then, the solution was cooled, and cyclohexanone was added thereto such that the content of the compound J having an imide structure in the solution was 30% by weight.

Synthesis Example 11

Synthesis of Compound K Having Imide Structure (Comparative Example 2)

In a three-necked 500 mL flask equipped with a nitrogen-introducing tube, an agitator and a thermometer, 36.6 g (100 mmol) of 6FAP as a diamine component and 19.6 g (90 mmol) of PMDA as an acid component were mixed in 130 g of cyclohexanone under dry nitrogen gas flow, and the resulting solution was stirred at 60° C. for 1 hour. MA as an end cap compound in an amount of 1.96 g (20 mmol) was added thereto, and after stirring the solution at 60° C. for 1 hour, the temperature of the solution was raised to 160° C., and after a period of time, precipitates formed. Therefore, 121 g of N-methylpyrrolidone (produced by Mitsubishi Chemical Corporation) was added thereto, and the resultant was stirred at 180° C. for 4 hours while removing solvent and water, and properly adding cyclohexanone thereto.

Then, the solution was cooled, and cyclohexanone was added thereto such that the content of the compound K having an imide group in the solution was 20% by weight.

Synthesis Example 12

Synthesis of Compound L Having Imide Structure (Comparative Example 3)

In a 1 L separable flask equipped with a cooling tube and a stirrer, 31.0 g (100 mmol) of bis(3,4-dicarboxyphenyl)ether dianhydride (ODPA, produced by MANAC INCORPORATED) as an acid component and 32.9 g (90 mmol) of 6FAP as a diamine component were mixed in 150 g of cyclohexanone, and the resultant was stirred at a temperature of 60° C. for 1 hour. Thereafter, 2.2 g (20 mmol) of 3-aminophenol (AMP, produced by Tokyo Chemical Industry Co., Ltd.) as an end cap compound was added with 10 g of cyclohexanone thereto, the temperature of the resulting solution was raised to 160° C., and the resultant was stirred for 6 hours while removing the formed water with cyclohexanone and properly adding cyclohexanone thereto.

Then, the solution was cooled, and cyclohexanone was added thereto such that the content of the compound L having an imide group in the solution was 30% by weight.

Synthesis Example 13

Synthesis of Compound M Having Imide Structure (Comparative Example 4)

In a three-necked 500 mL flask equipped with a nitrogen-introducing tube, an agitator and a thermometer, 24.8 g (100 mmol) of 3,3'-diaminodiphenylsulfone (3,3'-DDS, produced by Tokyo Chemical Industry Co., Ltd.) as a diamine component was dissolved in 100 g of cyclohexanone under dry nitrogen gas flow. MA as an end cap compound in an amount of 19.6 g (200 mmol) was added thereto, and the resulting solution was stirred at 60° C. for 1 hour. Thereafter, the temperature of the solution was raised to 160° C., and the resultant was reacted for 6 hours while evaporating the formed water and properly adding cyclohexanone thereto.

Then, the solution was cooled, and cyclohexanone was added thereto such that the content of the compound M having an imide group in the solution was 30% by weight.

Synthesis Example 14

Synthesis of Compound N Having Imide Structure (Comparative Examples 7 and 8, and Synthesis Example 2 in JP 2009-161605 A)

To a four-necked 2 L flask made of glass equipped with a stirrer, a cooled condenser, a thermometer and a dropping funnel, 98.06 g (1.0 mol) of MA, 600 g of N-methylpyrrolidone and 200 g of toluene were fed, and dissolved completely. To the resulting solution, 247 g (0.5 mol) of 2,2'-methylenebis{4-methyl-6-(3,5-dimethyl-4-aminobenzyl)phenol} was added while paying attention to the reaction temperature, and the resulting solution was further aged at 40° C. for 30 minutes. Thereafter, the temperature of the solution was raised to 130° C., and the reaction mixture was subjected to dehydration at 130 to 135° C. for 4 hours under reflux to carry out ring closure reaction. After the reaction was completed, the reaction solution was cooled, added to 3 L of methanol, and the formed precipitates were filtered. Further, the crystals were washed sufficiently with 1 L of cold water, and dried. The weight of the dried crystals was 325 g. The compound in an amount of 30 g was dissolved in 70 g of N-methylpyrrolidone.

Example 1

The solution of the compound A having an imide structure obtained in Synthesis Example 1 in an amount of 50 g and 10.9 g of bisphenol A type epoxy compound "jER" 828 (Trade Name, hereinafter referred to as jER828, produced by Mitsubishi Chemical Corporation, epoxy equivalent: 185 g/eq) were stirred and mixed with Planetary mixer/deaerator (MAZERUSTAR (produced by KURABO INDUSTRIES, Ltd.)) at 25° C. for 60 minutes to obtain epoxy resin composition 1. The solubility in cyclohexanone, glass transition temperature, coefficient of thermal expansion and viscosity of the obtained epoxy resin composition 1 were evaluated by the above-described method.

Example 2

The epoxy resin composition 2 was obtained in the same manner as in Example 1 except that 50 g of the solution of the compound B having an imide structure was used instead of 50 g of the solution of the compound A having an imide structure, and evaluation was carried out in the same manner as in Example 1.

Example 3

The epoxy resin composition 3 was obtained in the same manner as in Example 1 except that 53 g of the solution of the compound C having an imide structure was used instead of 30 g of the solution of the compound A having an imide structure, and evaluation was carried out in the same manner as in Example 1.

Example 4

The epoxy resin composition 4 was obtained in the same manner as in Example 1 except that 52 g of the solution of the compound D having an imide structure was used instead of 50 g of the solution of the compound A having an imide structure, and evaluation was carried out in the same manner as in Example 1.

Example 5

The epoxy resin composition 5 was obtained in the same manner as in Example 1 except that 48 g of the solution of the compound E having an imide structure was used instead of 50 g of the solution of the compound A having an imide structure, and evaluation was carried out in the same manner as in Example 1.

Example 6

The epoxy resin composition 6 was obtained in the same manner as in Example 1 except that 56 g of the solution of the compound F having an imide structure was used instead of 50 g of the solution of the compound A having an imide structure, and evaluation was carried out in the same manner as in Example 1.

Example 7

The epoxy resin composition 7 was obtained in the same manner as in Example 1 except that 52.6 g of the solution of the compound G having an imide structure was used instead of 50 g of the solution of the compound A having an imide structure, and evaluation was carried out in the same manner as in Example 1.

Example 8

The epoxy resin composition 8 was obtained in the same manner as in Example 1 except that 66 g of the solution of the compound H having an imide structure was used instead of 50 g of the solution of the compound A having an imide structure, and evaluation was carried out in the same manner as in Example 1.

Example 9

The epoxy resin composition 9 was obtained in the same manner as in Example 1 except that 91.4 g of the solution of the compound I having an imide structure was used instead of 50 g of the solution of the compound A having an imide structure, and evaluation was carried out in the same manner as in Example 1.

Comparative Example 1

The epoxy resin composition 10 was obtained in the same manner as in Example 1 except that 49 g of the solution of the compound J having an imide structure was used instead of 50 g of the solution of the compound A having an imide structure, and evaluation was carried out in the same manner as in Example 1.

Comparative Example 2

The epoxy resin composition 11 was obtained in the same manner as in Example 1 except that 76 g of the solution of the compound K having an imide structure was used instead of 50 g of the solution of the compound A having an imide structure, and evaluation was carried out in the same manner as in Example 1. However, layer separation between the epoxy and the polyimide was occurred during the curing reaction.

Comparative Example 3

The epoxy resin composition 12 was obtained in the same manner as in Example 1 except that 64.5 g of the solution of the compound L having an imide structure was used instead of 50 g of the solution of the compound A having an imide structure, and evaluation was carried out in the same manner as in Example 1.

Comparative Example 4

The epoxy resin composition 13 was obtained in the same manner as in Example 1 except that 50 g of the solution of the compound M having an imide structure (bismaleimide compound solution) was used instead of 50 g of the solution of the compound A having an imide structure, and 1 g of N-methylimidazole was added as a curing agent, and evaluation was carried out in the same manner as in Example 1.

Comparative Example 5

The epoxy resin composition 14 was obtained in the same manner as in Example 1 except that the solution containing 15 g of polyethersulfone resin (Trade Name: Sumika Excel 5003P, produced by Sumitomo Chemical Company, Limited, weight average molecular weight: 67250, the content of terminal phenolic hydroxyl group: 46% by mole, glass transition temperature: 230° C.) and 10 g of 4,4'-diaminodiphenylsulfone (hereinafter referred to as "4,4'-DDS", produced by Wako Pure Chemical Industries, Ltd.) dissolved in 35 g of N-methylpyrrolidone was used instead of 50 g of the solution of the compound A having an imide structure, and evaluation was carried out in the same manner as in Example 1.

Comparative Example 6

The same procedure was carried out as in Example 1 except that the solution containing 15 g of 6FAP dissolved in 35 g of cyclohexanone was used instead of 50 g of the solution of the compound A having an imide structure. However, gelation proceeds during the mixing, and the evaluation cannot be carried out.

Example 10

The epoxy resin composition 15 was obtained in the same manner as in Example 1 except that cresol novolak type epoxy compound "EPICLON" N660 (Trade Name, hereinafter referred to as N660, produced by DIC Corporation, epoxy equivalent: 207 g/eq) was used instead of jER828, and evaluation was carried out in the same manner as in Example 1.

Example 11

The epoxy resin composition 16 was obtained in the same manner as in Example 1 except that 5.4 g of p-aminophenol type epoxy compound "jER" 630 (Trade Name, jER630, produced by Mitsubishi Chemical Corporation, epoxy equivalent: 96 g/eq) was used instead of jER 828, and evaluation was carried out in the same manner as in Example 1.

Example 12

The epoxy resin composition 17 was obtained in the same manner as in Example 1 except that 7.7 g of tetraglycidyl-diaminodiphenylsulfone (Trade Name, TGDAS, produced by Konishi Chemical Ind. Co., Ltd., epoxy equivalent: 138 g/eq), 5.0 g of bisphenol F type epoxy compound "jER" 807 (Trade Name, hereinafter referred to as jER807 produced by Mitsubishi Chemical Corporation, epoxy equivalent: 171 g/eq) and 1.8 g of 4,4'-DDS were used instead of jER828, and evaluation was carried out in the same manner as in Example 1.

Example 13

The epoxy resin composition 18 was obtained in the same manner as in Example 1 except that 17 g of naphthalene type epoxy compound "EPICLON" HP4710 (Trade Name, produced by DIC Corporation, equivalent: 171 g/eq), 2.5 g of jER807 and 3.6 g of 4,4'-DDS were used instead of jER828, and evaluation was carried out in the same manner as in Example 1.

Comparative Example 7

The epoxy resin composition 19 was obtained in the same manner as in Example 1 except that 50 g of the solution of hydroxyl group-containing maleimide N was used instead of 50 g of the solution of the compound A having an imide structure, and cresol novolak type epoxy compound N660 was used instead of "jER"828, and evaluation was carried out in the same manner as in Example 1.

Comparative Example 8

The epoxy resin composition 20 was obtained in the same manner as in Example 1 except that 50 g of the solution of hydroxyl group-containing maleimide N was used instead of 50 g of the solution of the compound A having an imide structure, and evaluation was carried out in the same manner as in Example 1.

The composition and evaluation result of each Example and Comparative Example are shown in Table 1 and Table 2.

TABLE 1

| | Compound having imide structure | Diamine component | Molar ratio | Acid component | Molar ratio | End cap compound | Molar ratio | Mean of v in Formula (1)* | Number average molecular weight | Hydroxyl equivalent (g/eq) | Epoxy compound | Epoxy equivalent (g/eq) |
|---|---|---|---|---|---|---|---|---|---|---|---|---|
| Example 1 | A | 6FAP | 100 | PMDA | 50 | MA | 100 | 1 | 1070 | 268 | jER828 | 185 |
| Example 2 | B | 6FAP | 100 | PMDA | 75 | MA | 50 | 3 | 2170 | 268 | jER828 | 185 |
| Example 3 | C | 6FAP | 100 | BPDA | 55 | MA | 90 | 1.22 | 1260 | 287 | jER828 | 185 |
| Example 4 | D | ABPS | 100 | 6FDA | 50 | NA | 100 | 1 | 1260 | 282 | jER828 | 185 |
| Example 5 | E | ADPE | 100 | 6FDA | 50 | MA | 100 | 1 | 1030 | 258 | jER828 | 185 |
| Example 6 | F | 6FAP | 100 | PMDA | 50 | NA | 100 | 1 | 1210 | 301 | jER828 | 185 |
| Example 7 | G | BAHF(FL) | 100 | PMDA | 50 | MA | 100 | 1 | 1100 | 276 | jER828 | 185 |
| Example 8 | H | BAHF(FL) | 100 | BSAA | 50 | MA | 100 | 1 | 1380 | 351 | jER828 | 185 |
| Example 9 | I | DAE, BAHF(FL) | 100 | BSAA | 80 | MA | 40 | 4 | 3820 | 478 | jER828 | 185 |
| Comparative Example 1 | J | 6FAP | 100 | — | — | MA | 200 | — | 530 | 263 | jER828 | 185 |
| Comparative Example 2 | K | 6FAP | 100 | PMDA | 90 | MA | 20 | 9 | 5460 | 274 | jER828 | 185 |
| Comparative Example 3 | L | 6FAP | 90 | ODPA | 100 | AMP | 20 | 10 | 6950 | 348 | jER828 | 185 |
| Comparative Example 4 | M | DDS | 100 | — | — | MA | 200 | — | 410 | 0 | jER828 | 185 |
| Comparative Example 5 | — | DDS | — | — | — | — | — | — | — | 0 | jER828 | 185 |
| Comparative Example 6 | — | 6FAP | — | — | — | — | — | — | — | 183 | jER828 | 185 |
| Example 10 | A | 6FAP | 100 | PMDA | 50 | MA | 100 | 1 | 1070 | 268 | N660 | 207 |
| Example 11 | A | 6FAP | 100 | PMDA | 50 | MA | 100 | 1 | 1070 | 268 | jER630 | 96 |
| Example 12 | A | 6FAP | 100 | PMDA | 50 | MA | 100 | 1 | 1070 | 268 | TGDAS/jER807 | 138/171 |
| Example 13 | A | 6FAP | 100 | PMDA | 50 | MA | 100 | 1 | 1070 | 268 | HP4710/jER807 | 171/171 |
| Comparative Example 7 | N | — | — | — | — | — | — | — | — | — | N660 | 207 |
| Comparative Example 8 | N | — | — | — | — | — | — | — | — | — | jER828 | 185 |

*as for Comparative Example 3, although the compound does not satisfy the Formula (1), the number of the recurring units of diamine-tetracarboxylic acid unit was determined in the same manner as in the case of the compound satisfying the Formula (1).

TABLE 2

| | Solubility in cyclohexanone | Glass transition temperature (° C.) | Coefficient of thermal expansion (ppm/° C.) | Viscosity (mPa·s) |
|---|---|---|---|---|
| Example 1 | ○ | 254 | 59 | 1250 |
| Example 2 | ○ | 278 | 53 | 1350 |
| Example 3 | ○ | 263 | 60 | 1524 |
| Example 4 | ○ | 265 | 52 | 1650 |
| Example 5 | ○ | 245 | 54 | 1400 |
| Example 6 | ○ | 235 | 60 | 1450 |

TABLE 2-continued

| | Solubility in cyclohexanone | Glass transition temperature (° C.) | Coefficient of thermal expansion (ppm/° C.) | Viscosity (mPa·s) |
|---|---|---|---|---|
| Example 7 | ○ | 244 | 56 | 1350 |
| Example 8 | ○ | 244 | 56 | 1350 |
| Example 9 | ○ | 242 | 54 | 2200 |
| Comparative Example 1 | ○ | 220 | 60 | 1100 |
| Comparative Example 2 | X | cannot be measured | — | — |
| Comparative Example 3 | X | 220 | 59 | 5300 |
| Comparative Example 4 | ○ | 150 | 65 | 880 |
| Comparative Example 5 | X | 150 | 58 | — |
| Comparative Example 6 | ○ | cannot be measured | — | — |
| Example 10 | ○ | 320 | 45 | 10500 |
| Example 11 | ○ | 353 | 39 | 11500 |
| Example 12 | ○ | 317 | 39 | 13550 |
| Example 13 | ○ | 308 | 38 | 15550 |
| Comparative Example 7 | — | 300 | — | >100000 |
| Comparative Example 8 | — | 220 | — | 5000 |

INDUSTRIAL AVAILABILITY

According to the present invention, the epoxy resin composition which has an extremely high glass transition temperature for the epoxy resin composition and low coefficient of thermal expansion, and which is soluble in a ketone solvent such as methyl ethyl ketone, cyclohexanone or the like to have excellent processibility, can be provided.

The invention claimed is:

1. An epoxy resin composition comprising a compound (a) having an imide structure represented by the Formula (1), and a compound (b) having at least two epoxy groups, wherein the compound (a) having an imide structure represented by the Formula (1) has a number average molecular weight of 1,000 to 5,000:

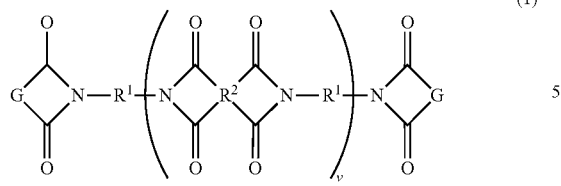

(1)

wherein $R^1$ has a structure represented by the Formula (2) in an amount of not less than 50%; $R^2$ is selected from the Formulae (4) below wherein different $R^2$s are optionally employed in combination; the benzene ring in any structures selected from the Formulae (4) below is optionally substituted by one or more groups selected from the group consisting of hydroxyl group, $C_1$-$C_4$ alkyl groups, $C_1$-$C_4$ fluoroalkyl groups, $C_1$-$C_4$ alkoxyl groups, $C_1$-$C_4$ fluoroalkoxyl groups, $C_2$-$C_5$ ester groups, carboxyl group, cyano group and nitro group; v is an integer of 1 to 8; and G is selected from the Formulae (5) below wherein different Gs are optionally employed in combination;

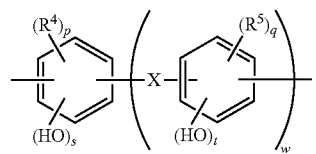

(2)

wherein $R^4$ and $R^5$ are each independently selected from the group consisting of $C_1$-$C_4$ alkyl groups, $C_1$-$C_4$ fluoroalkyl groups, $C_1$-$C_4$ alkoxyl groups, $C_1$-$C_4$ fluoroalkoxyl groups, $C_2$-$C_5$ ester groups, carboxyl group, cyano group and nitro group wherein these groups are optionally employed individually or different groups are optionally employed in combination as each of $R^4$ and $R^5$; X is selected from the group consisting of direct bond, —$CH_2$—, —$C(CH_3)_2$—, —$C(CF_3)_2$—, —$C(C_2F_5)_2$—, —O—, —$SO_2$—, fluorene, —CO—, —COO—, —CONH—, —$CF_2$— and the Formulae (3) below wherein different Xs are optionally employed in combination; p and q are integers of 0 to 3, s and t are integers of 0 to 4, and s+t>0; and w is an integer of 0 to 8;

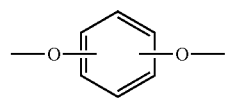

(3)

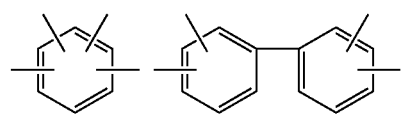

(4)

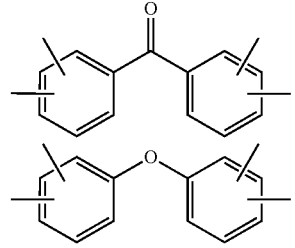

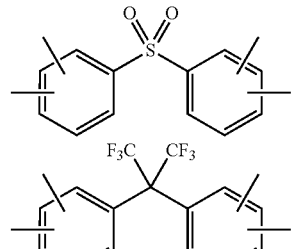

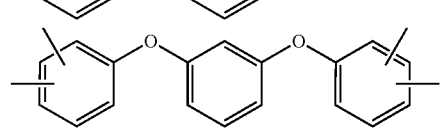

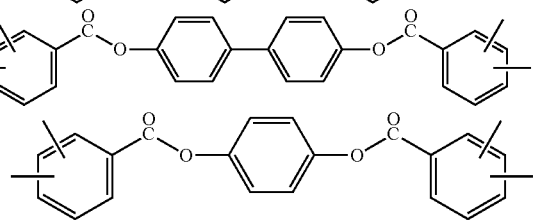

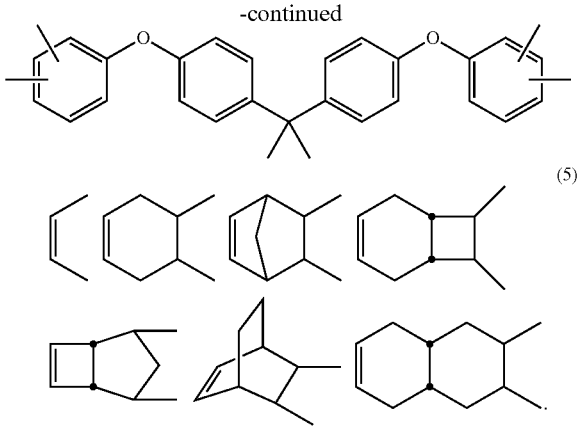

(5)

2. The epoxy resin composition according to claim 1, wherein the compound (b) having at least two epoxy groups is one or more compounds selected from the Formulae (6) to (9) below:

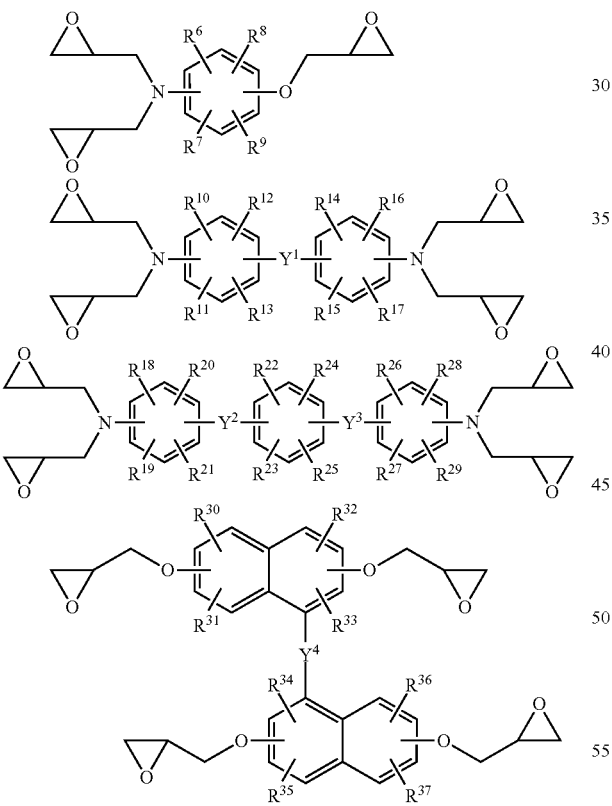

wherein $R^6$ to $R^{37}$ are each independently selected from the group consisting of hydrogen atom, halogen atom, $C_1$-$C_6$ alkyl groups, $C_1$-$C_6$ alkoxyl groups, $C_1$-$C_6$ fluoroalkyl groups, cycloalkyl groups and aryl groups wherein these groups are optionally employed individually or different groups are optionally employed in combination as each of $R^6$ to $R^{37}$; and $Y^1$ to $Y^4$ are each independently selected from the group consisting of direct bond, methylene group, ether group, thioether group, $SO_2$ group, isopropylene group and groups represented by the Formula (10) below wherein these groups are optionally employed individually or different groups are optionally employed in combination as each of $Y^1$ to $Y^4$;

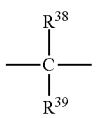

(10)

wherein $R^{38}$ and $R^{39}$ are each independently selected from the group consisting of hydrogen atom, halogen atom, $C_1$-$C_6$ alkyl groups, $C_1$-$C_6$ alkoxyl groups, $C_1$-$C_6$ fluoroalkyl groups, cycloalkyl groups and aryl groups wherein these groups are optionally employed individually or different groups are optionally employed in combination as each of $R^{38}$ and $R^{39}$.

3. The epoxy resin composition according to claim 1, which is dissolved in cyclohexanone to a concentration of not less than 30% by weight.

4. A method for producing an epoxy resin composition, the method comprising the steps of:
  mixing a diamine having a structure represented by the Formula (2)' below in an amount of not less than 50% by mole, one or more tetracarboxylic dianhydrides selected from the Formulae (4)' below, and one or more compounds selected from the Formulae (5)' below in a solvent (c)' having a ketone group under the condition of 50 to 80° C. for 0.5 to 2 hours to obtain a compound (a) having an imide structure represented by the Formula (1); and
  mixing the compound (a) with a compound (b) having at least two epoxy groups;

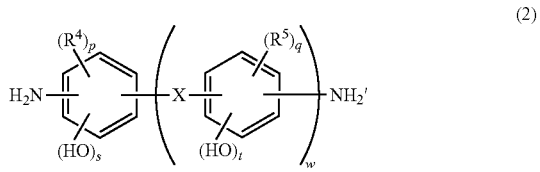

(2)

wherein $R^4$ and $R^5$ are each independently selected from the group consisting of $C_1$-$C_4$ alkyl groups, $C_1$-$C_4$ fluoroalkyl groups, $C_1$-$C_4$ alkoxyl groups, $C_1$-$C_4$ fluoroalkoxyl groups, $C_2$-$C_5$ ester groups, carboxyl group, cyano group and nitro group wherein these groups are optionally employed individually or different groups are optionally employed in combination as each of $R^4$ and $R^5$; X is selected from the group consisting of direct bond, —$CH_2$—, —$C(CH_3)_2$—, —$C(CF_3)_2$—, —$C(C_2F_5)_2$—, —O—, —$SO_2$—, fluorene, —CO—, —COO—, —CONH—, —$CF_2$— and the Formula (3) below wherein different Xs are optionally employed in combination; p and q are integers of 0 to 3, s and t are integers of 0 to 4 and s+t>0; and w is an integer of 0 to 8;

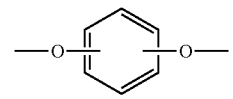
(3)
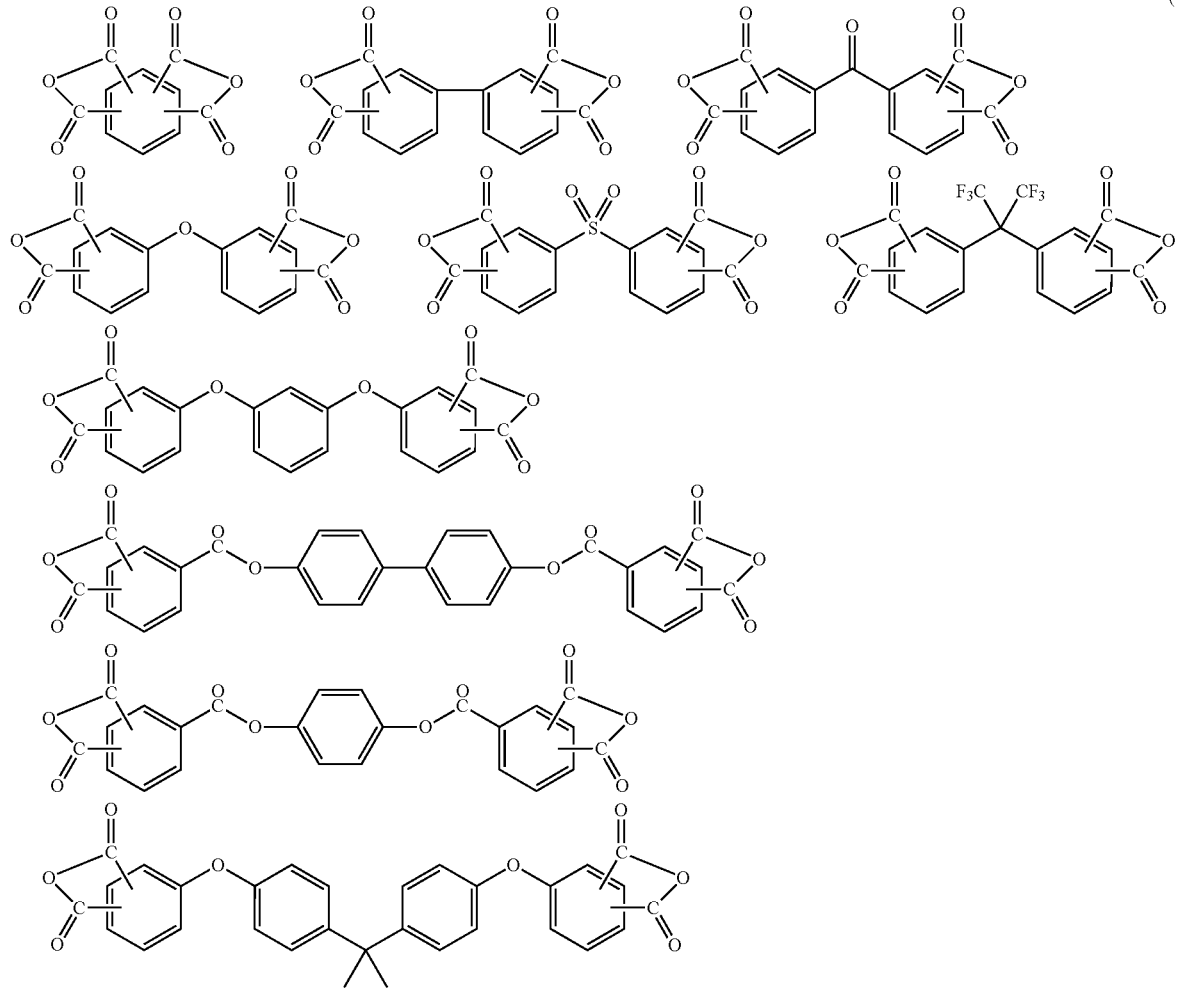
(4')
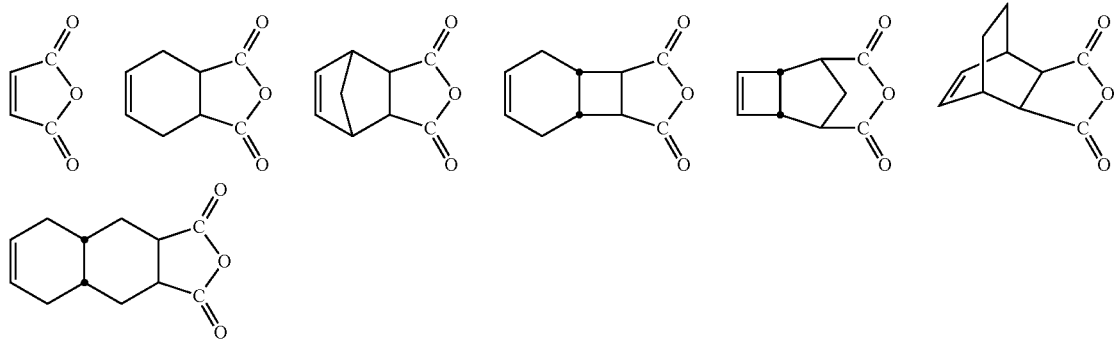
(5')
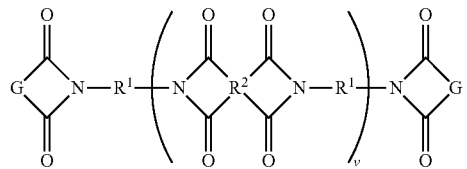
(1)

wherein $R^1$ has a structure represented by the Formula (2) in an amount of not less than 50%; $R^2$ is selected from the Formulae (4) below wherein different $R^2$s are optionally employed in combination; the benzene ring in any structures selected from the Formulae (4) below is optionally substituted by one or more groups selected from the group consisting of hydroxyl group, $C_1$-$C_4$ alkyl groups, $C_1$-$C_4$ fluoroalkyl groups, $C_1$-$C_1$ alkoxyl groups, $C_1$-$C_4$ fluoroalkoxyl groups, $C_2$-$C_5$ ester groups, carboxyl group, cyano group and nitro group; v is an integer of 1 to 8; and G is selected from the Formulae (5) below wherein different Gs are optionally employed in combination;

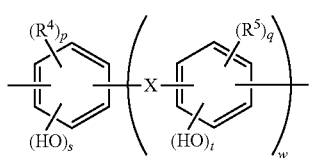

(2)

wherein $R^4$ and $R^5$ are each independently selected from the group consisting of $C_1$-$C_4$ alkyl groups, $C_1$-$C_4$ fluoroalkyl groups, $C_1$-$C_4$ alkoxyl groups, $C_1$-$C_4$ fluoroalkoxyl groups, $C_2$-$C_5$ ester groups, carboxyl group, cyano group and nitro group wherein these groups are optionally employed individually or different groups are optionally employed in combination as each of $R^4$ and $R^5$; X is selected from the group consisting of direct bond, —$CH_2$—, —$C(CH_3)_2$—, —$C(CF_3)_2$—, —$C(C_2F_5)_2$—, —O—, —$SO_2$—, fluorene, —CO—, —COO—, —CONH—, —$CF_2$— and the Formula (3) below wherein different Xs are optionally employed in combination; p and q are integers of 0 to 3, s and t are integers of 0 to 4 and s+t>0; and w is an integer of 0 to 8;

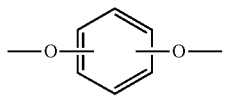

(3)

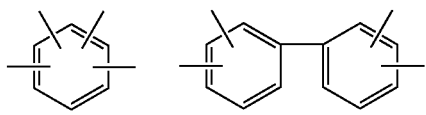

(4)

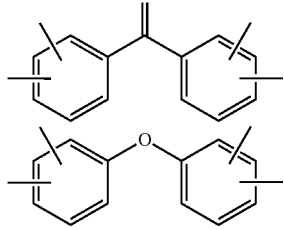

-continued

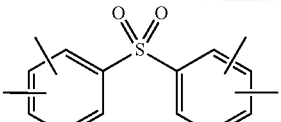

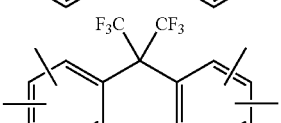

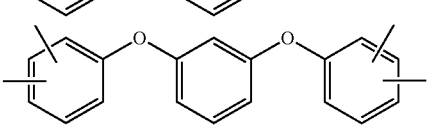

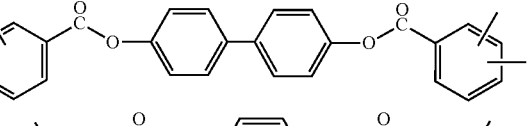

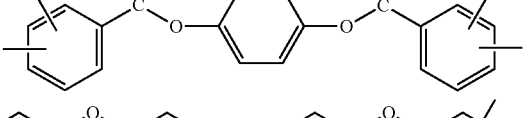

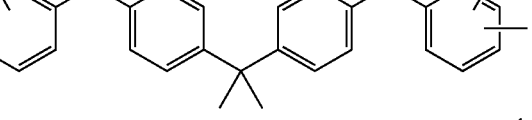

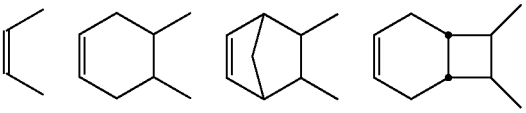

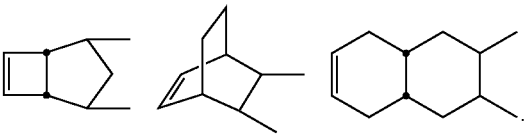

(5)

5. A semiconductor device comprising the epoxy resin composition according to claim 1.

6. The epoxy resin composition according to claim 2, which is dissolved in cyclohexanone to a concentration of not less than 30% by weight.

7. A semiconductor device comprising the epoxy resin composition according to claim 2.

8. A semiconductor device comprising the epoxy resin composition according to claim 3.

9. A semiconductor device comprising the epoxy resin composition according to claim 6.

* * * * *